(12) United States Patent
Lu et al.

(10) Patent No.: US 12,507,432 B2
(45) Date of Patent: Dec. 23, 2025

(54) TRANSISTOR STRUCTURE WITH REDUCED LEAKAGE CURRENT AND ADJUSTABLE ON/OFF CURRENT

(71) Applicants: Etron Technology, Inc., Hsinchu (TW); Invention And Collaboration Laboratory Pte. Ltd., Singapore (SG)

(72) Inventors: Chao-Chun Lu, Taipei (TW); Li-Ping Huang, Taipei (TW)

(73) Assignees: Etron Technology, Inc., Hsinchu (TW); Invention And Collaboration Laboratory Pte. Ltd., Singapore (SG)

( * ) Notice: Subject to any disclaimer, the term of this patent is extended or adjusted under 35 U.S.C. 154(b) by 40 days.

(21) Appl. No.: 18/111,899

(22) Filed: Feb. 21, 2023

(65) Prior Publication Data
US 2023/0207645 A1    Jun. 29, 2023

Related U.S. Application Data

(62) Division of application No. 16/847,693, filed on Apr. 14, 2020, now Pat. No. 11,616,128.
(Continued)

(51) Int. Cl.
*H10D 30/62* (2025.01)
*H10D 30/60* (2025.01)
*H10D 62/17* (2025.01)

(52) U.S. Cl.
CPC ....... *H10D 30/6219* (2025.01); *H10D 30/601* (2025.01); *H10D 30/603* (2025.01); *H10D 30/62* (2025.01); *H10D 62/371* (2025.01)

(58) Field of Classification Search
CPC ........... H01L 29/41791; H01L 29/1083; H01L 29/7833; H01L 29/7835; H01L 29/785; H01L 29/0847; H01L 29/6653; H01L 29/6656; H01L 29/66636; H01L 29/0649; H01L 29/0638; H01L 29/66553; H01L 29/66568; H01L 29/66545; H01L 21/76846; H01L 21/76849; H01L 29/7845; H01L 21/76834; H01L 21/76801; H01L 21/0337; H01L 21/28247; H01L 21/28568; H01L 21/3086; H01L 21/31105; H01L 21/31144; H01L 21/76224;
(Continued)

(56) References Cited

U.S. PATENT DOCUMENTS 4,873,205 A    10/1989  Critchlow
4,877,750 A    10/1989  Okumura
(Continued)

FOREIGN PATENT DOCUMENTS

CN       1450653 A    10/2003
CN     101908543 A    12/2010
(Continued)

*Primary Examiner* — Moin M Rahman
(74) *Attorney, Agent, or Firm* — Winston Hsu

(57) ABSTRACT

A transistor structure includes a gate, a spacer, a channel region, a first concave, and a first conductive region. The gate is above a silicon surface. The spacer is above the silicon surface and at least covers a sidewall of the gate. The channel region is under the silicon surface. The first conductive region is at least partially formed in the first concave, wherein a conductive region of a neighborhood transistor structure next to the transistor structure is at least partially formed in the first concave.

17 Claims, 21 Drawing Sheets

Related U.S. Application Data

(60) Provisional application No. 62/872,254, filed on Jul. 10, 2019, provisional application No. 62/853,675, filed on May 28, 2019, provisional application No. 62/836,088, filed on Apr. 19, 2019.

(58) Field of Classification Search
CPC ..... H01L 21/823481; H01L 21/823807; H01L 21/823814; H01L 21/823821; H01L 21/823842; H01L 21/823857; H01L 21/823871; H01L 21/823878; H01L 23/5283; H01L 23/53266; H01L 27/0924; H01L 27/1104; H01L 28/24; H01L 29/516; H01L 29/7854; H01L 21/28518; H01L 23/5329; H01L 27/0207; H01L 28/20; H01L 29/41783; H01L 21/02532; H01L 21/02636; H01L 21/76802; H01L 21/76877; H01L 21/823828; H01L 23/528; H01L 27/0922; H01L 29/167; H01L 29/7851; H01L 29/66795; H01L 29/7846; H01L 29/165; H01L 21/76897; H01L 23/5226; H01L 23/53209; H01L 23/53238; H01L 21/76816; H01L 29/66818; H01L 29/7848; H01L 29/7843; H01L 27/0886; H01L 21/76232; H01L 29/0653; H01L 21/823431; H01L 21/76883; H01L 21/76885; H01L 29/665; H01L 21/02164; H01L 21/0217; H01L 21/0332; H01L 21/823437; H01L 21/823475; H01L 24/16; H01L 29/7842; H01L 29/7853; H01L 2224/16227; H01L 24/32; H01L 24/73; H01L 2224/32225; H01L 2224/73204; H01L 23/485; H01L 21/02603; H01L 21/30604; H01L 25/105; H01L 21/30625; H01L 21/6835; H01L 21/02068; H01L 21/32134; H01L 21/32136; H01L 21/32137; H01L 21/3213; H01L 21/0228; H10D 62/121; H10D 30/62; H10D 30/6735; H10D 30/794; H10D 30/797; H10D 62/115; H10D 62/151; H10D 62/292; H10D 62/822; H10D 64/017; H10D 64/021; H10D 64/257; H10D 64/62; H10D 30/014; H10D 30/0323; H10D 30/43; H10D 30/6744; H10D 30/6757; H10D 64/251; H10D 62/116; H10D 62/364; H10D 30/6219; H10D 30/024–0245; H10D 84/0158; H10D 84/0193; H10D 86/011; H10D 84/834; H10D 84/853; H10D 86/215; H10D 30/60–798; H10D 30/021–0415; H10D 84/83–859; H10D 84/0128; H10D 84/0167; H10D 62/85–854; H10D 30/751; H10D 30/027–0278; H10D 30/63; H10D 84/016; H10D 84/0195; H10D 30/501–509; H10D 84/85; H10D 30/6728; H10D 30/6733; H10D 62/118; H10D 89/931; H10D 64/252; H10D 84/0188; H10D 84/201; H10D 18/60; H10D 84/014; H10D 84/0177; H10D 84/038; H10D 30/6215; H10D 30/0217; H10B 12/36; H10B 12/056; H10B 63/34; H02K 15/027; A23B 2/783; A45C 11/003; A61K 40/4218; H10F 77/955; H10H 20/826; B82Y 10/00

See application file for complete search history.

(56) References Cited

U.S. PATENT DOCUMENTS

| | | | |
|---|---|---|---|
| 5,874,757 A | 2/1999 | Chao | |
| 9,048,339 B2 | 6/2015 | Cheng | |
| 9,530,851 B1* | 12/2016 | Lu | H10D 84/83 |
| 9,553,173 B1 | 1/2017 | Lam | |
| 10,971,499 B2 | 4/2021 | Lu | |
| 11,456,300 B2 | 9/2022 | Lu | |
| 11,877,439 B2 | 1/2024 | Lu | |
| 2001/0025993 A1 | 10/2001 | Inoue | |
| 2001/0046766 A1 | 11/2001 | Asakawa | |
| 2004/0125652 A1 | 7/2004 | Hsu | |
| 2004/0184327 A1 | 9/2004 | Okuda | |
| 2005/0145952 A1* | 7/2005 | Gonzalez | H01L 29/41783 |
| | | | 257/E29.267 |
| 2006/0131657 A1 | 6/2006 | Hamaguchi | |
| 2008/0195894 A1 | 8/2008 | Schreck | |
| 2009/0001468 A1 | 1/2009 | Shin | |
| 2009/0075029 A1 | 3/2009 | Thomas | |
| 2010/0081244 A1 | 4/2010 | Papageorgiou | |
| 2010/0246152 A1 | 9/2010 | Lin | |
| 2011/0117732 A1 | 5/2011 | Bauer | |
| 2012/0091469 A1 | 4/2012 | Park | |
| 2012/0104514 A1 | 5/2012 | Park | |
| 2013/0052809 A1* | 2/2013 | Tung | H10D 30/0275 |
| | | | 438/503 |
| 2013/0146957 A1 | 6/2013 | Cheng | |
| 2013/0285155 A1* | 10/2013 | Glass | H10D 30/6757 |
| | | | 257/369 |
| 2014/0084350 A1 | 3/2014 | Kim | |
| 2014/0193960 A1 | 7/2014 | Fukuda | |
| 2015/0236157 A1 | 8/2015 | Kwok | |
| 2016/0056290 A1* | 2/2016 | Tsai | H10D 62/021 |
| | | | 257/192 |
| 2016/0204106 A1 | 7/2016 | You | |
| 2017/0373148 A1 | 12/2017 | Cheng | |
| 2018/0122956 A1* | 5/2018 | Richter | H01L 29/66628 |
| 2018/0286981 A1 | 10/2018 | Jang | |
| 2018/0315851 A1 | 11/2018 | Huang | |
| 2018/0323260 A1* | 11/2018 | Chang | H10D 62/021 |
| 2019/0051641 A1 | 2/2019 | Lee | |
| 2019/0053406 A1 | 2/2019 | Tezuka | |
| 2020/0126882 A1 | 4/2020 | Jang | |

FOREIGN PATENT DOCUMENTS

| | | |
|---|---|---|
| CN | 104037226 A | 9/2014 |
| CN | 104064467 A | 9/2014 |
| CN | 108695389 A | 10/2018 |
| CN | 111223934 A | 6/2020 |
| CN | 111696987 A | 9/2020 |
| JP | 2000-31425 A | 1/2000 |
| JP | 2015-522948 A | 8/2015 |
| KR | 10-2012-0038195 A | 4/2012 |
| KR | 10-2014-0038826 A | 3/2014 |
| KR | 10-2015-0096300 A | 8/2015 |
| WO | 99/25025 A1 | 5/1999 |

* cited by examiner

TRANSISTOR STRUCTURE WITH REDUCED LEAKAGE CURRENT AND ADJUSTABLE ON/OFF CURRENT

CROSS REFERENCE TO RELATED APPLICATIONS

This application is a division of U.S. application Ser. No. 16/847,693, filed on Apr. 14, 2020, which claims the benefit of U.S. Provisional Application No. 62/836,088, filed on Apr. 19, 2019, and claims the benefit of U.S. Provisional Application No. 62/853,675, filed on May 28, 2019, and claims the benefit of U.S. Provisional Application No. 62/872,254, filed on Jul. 10, 2019. The contents of these applications are incorporated herein by reference.

BACKGROUND OF THE INVENTION

1. Field of the Invention

The present invention relates to a transistor structure, and particularly to a transistor structure with a reduced leakage current.

2. Description of the Prior Art

The most widely used transistor is a metal-oxide-semiconductor field-effect transistor (MOSFET) made in a planar silicon wafer, which has a gate made above a silicon surface separated by a dielectric material. In addition, a source and a drain of the transistor are made into a substrate underneath the silicon surface. As dimensions of the transistor are scaled, a fin-structure transistor fin (e.g. field-effect transistor (FinFET), tri-gate field-effect transistor, double-gate transistor, etc.) is implemented so that the transistor can continue to scale down from 22 nm to 7 nm and beyond. However, most technologies of the fin-structure transistor emphasize their current drive capability for high performance by creating a high on current of the transistor, rather than emphasizing low leakage current capability for a low off current of the transistor. But, for deep nanometer silicon technology, the importance of using the fin-structure transistor as low-leakage and low-power devices is increasing, especially when the fin-structure transistor is used for switch devices in memory circuits such as in static random access memories (SRAMs), dynamic random access memories (DRAMs), portable integrated circuits (IC), or wearable ICs, etc.

For example, the most popular memory cell used for the DRAM is to have one access transistor and one storage capacitor. The state-of-art behavior of using either a planar transistor or the FinFET as the access transistor suffers from high leakage currents at an off state (e.g. more than 1 pico-amperes per cell), which is not acceptable as it causes stored signal charges of the DRAM to leak away quickly, thus demanding a very short refresh time to restore the stored signal (otherwise the stored signals are lost). In addition, it is well known that there are many leakage current sources during the off state, such as (a) gate-to-channel leakage, (b) gate-induced-drain leakage (GIDL), (c) drain-induced-barrier-lowering (DIBL) leakage, (d) sub-threshold channel leakage, (e) source/drain sidewall or area leakage due to p-n junctions in silicon materials, etc. In order to meet a low off current target near femto-amperes (fA) level per device, some transistor size parameters must be relaxed to unacceptable tolerances, which disobey the scaling theory that requires shrinking the dimensions of the transistor in order to reduce the cell size for achieving the Moore's Law economy. In an exaggerated example, for a 10-nanometer technology, a length of the gate must be over 100 nanometers in order to reduce the off current for meeting the 1 fA per cell requirement, which is impractical. Therefore, how to provide a transistor with low leakage current is an important issue for a designer of the DRAM system.

SUMMARY OF THE INVENTION

An embodiment of the present invention provides a transistor structure. The transistor structure includes a substrate, a gate, a spacer, a channel region, a concave, a first insulation layer, a first conductive region, a second conductive region, and a metal plug. The substrate has a semiconductor surface. The gate is above the semiconductor surface. The spacer is above the semiconductor surface and covers a sidewall of the gate. At least part of the channel region is under the gate. The concave is formed based on the semiconductor surface. The first insulation layer is formed in the concave. The first conductive region is electrically coupled to one terminal of the channel region, wherein the first conductive region is above the first insulation layer. The second conductive region is electrically coupled to another terminal of channel region. The metal plug is filled in the concave, wherein the metal plug at least contacts to a most lateral side of the first conductive region.

According to an aspect of the invention, the transistor structure is an asymmetric transistor, a first doping concentration profile of the first conductive region along a first extension direction is different from a second doping concentration profile of the second conductive region along a second extension direction.

According to an aspect of the invention, the transistor structure is an asymmetric transistor, a structure between the gate and the first conductive region is different from a structure between the gate and the second conductive region.

According to an aspect of the invention, the transistor structure is an asymmetric transistor, the first conductive region comprises a first lower part under the silicon surface and the second conductive region comprises a second lower part under the silicon surface, and a thickness of the first lower part is different from a thickness of the second lower part.

According to an aspect of the invention, the transistor structure is an asymmetric transistor, a width of the one terminal of the channel region next to the first conductive region is different from a width of the another terminal of the channel region next to the second conductive region.

According to an aspect of the invention, the transistor structure is an asymmetric transistor, a material of the first conductive region is different from a material of the second conductive region.

Another embodiment of the present invention provides a transistor structure. The transistor structure includes a substrate, a channel region, a gate region, a shallow trench isolation region, a first conductive region, and a metal plug. The substrate has an original surface. The first conductive region is between the gate region and the shallow trench isolation region, and the first conductive region is electrically contacted to the channel region. The metal region is between the gate region and the shallow trench isolation region. A most lateral side and a top side of the first conductive region contact to the metal region.

According to an aspect of the invention, the transistor structure further includes a concave under the original surface, wherein at least part of the first conductive region is disposed in the concave, and at least part of the metal region is disposed in the concave.

According to an aspect of the invention, an isolator is disposed in the concave and under a bottom of the first conductive region, and the isolator comprises a lateral portion on the bottom pf the concave and a upward portion underneath the bottom of the first conductive region, wherein a top surface of the lateral portion of the isolator is lower than a top surface of the upward portion of the isolator.

Another embodiment of the present invention provides a transistor structure. The transistor structure includes a gate, a spacer, a channel region, and a first conductive region. The gate is above a silicon surface. The spacer covers a sidewall of the gate. At least part of the channel region is under the gate and the spacer. The first conductive region is formed between the spacer and a side insulation layer, wherein a part of a sidewall of the first conductive region is covered by the side insulation layer.

According to an aspect of the invention, the first conductive region is partially formed in a first concave and the side insulation layer is partially formed in the first concave.

According to an aspect of the invention, a bottom insulation layer is formed in the first concave and the first conductive region is positioned on the bottom insulation layer.

According to an aspect of the invention, the first conductive region comprises a first upper part, a second upper part and a lower part, the first upper part and the second upper part contact to the spacer, and the lower part contacts to the channel region and is positioned on the bottom insulation layer.

According to an aspect of the invention, the transistor structure further includes a contact region at least partially formed in the first concave, wherein the second upper part of the first conductive region contacts with the contact region, and the first upper part and the lower part of the first conductive region are separated from the contact region by the side insulation layer.

According to an aspect of the invention, the first conductive region comprises silicon, silicon-carbide (SiC), or silicon-germanium (SiGe).

According to an aspect of the invention, the transistor structure further includes a second conductive region, another side insulation layer, and another contact region. The second conductive region is partially formed in a second concave. The another side insulation layer is partially formed in the second concave. The another contact region is partially formed in the second concave. The second conductive region includes a first upper part, a second upper part and a lower part, the lower part of the second conductive region contacts to the channel region, the second upper part of the second conductive region contacts with the another contact region, and the first upper part and the lower part of the second conductive region are separated from the another contact region by the another side insulation layer.

According to an aspect of the invention, the transistor structure further includes another spacer covering another sidewall of the gate, wherein a length of the channel region is not less than a sum of lengths of the gate, the spacer, and the another spacer.

According to an aspect of the invention, the spacer and the another spacer are re-growth spacers.

According to an aspect of the invention, the transistor structure further includes an LDD zone positioned underneath the spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
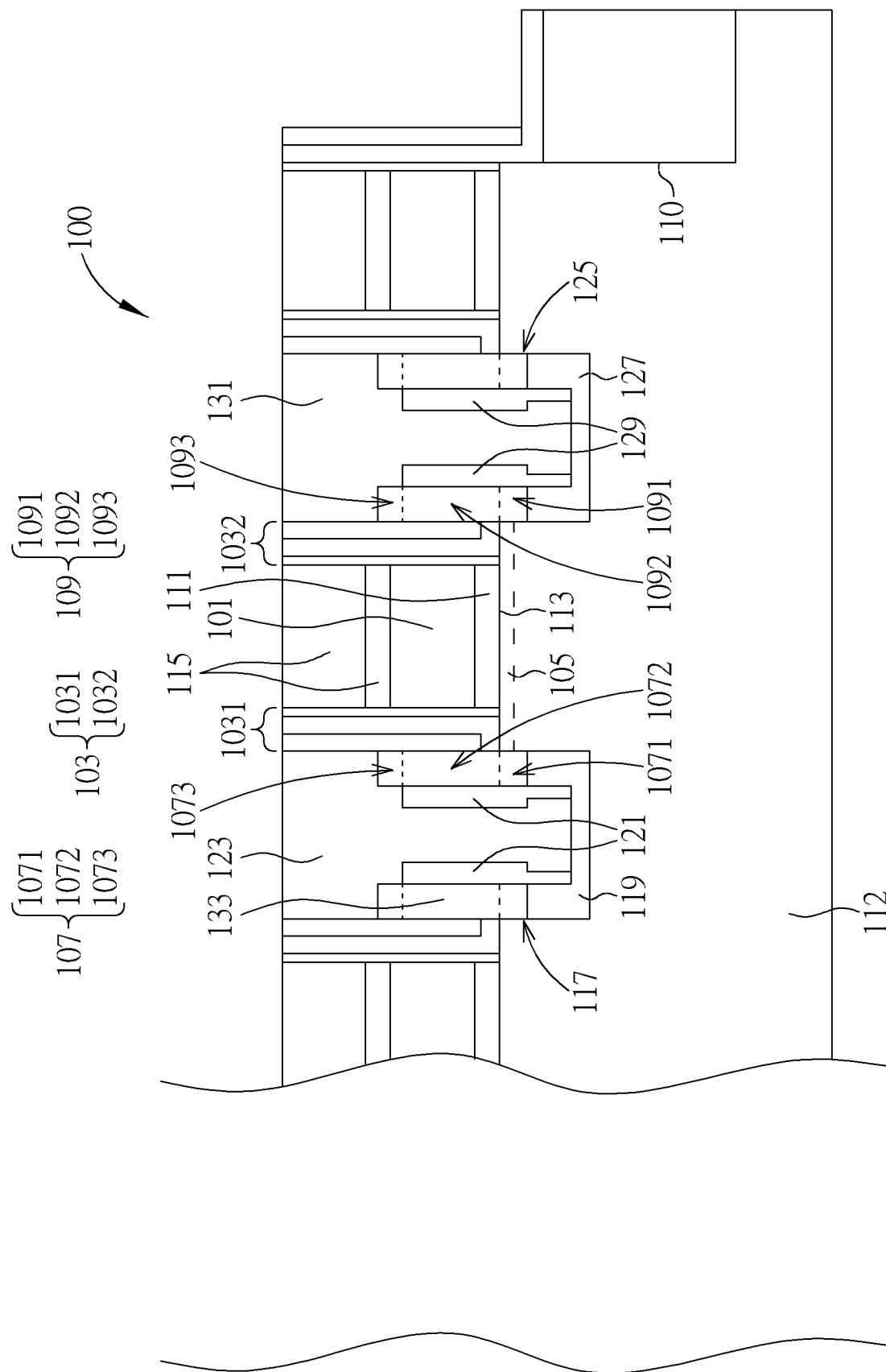
FIG. 1A is a diagram illustrating a transistor structure according to one embodiment of the present invention.

Please refer to FIG. 1A. FIG. 1A is a diagram illustrating a transistor structure 100 according to a first embodiment of the present invention. As shown in FIG. 1A, the transistor 100 includes a gate 101, a spacer 103, a channel region 105, a first conductive region 107, and a second conductive region 109. In addition, a shallow trench isolation (STI) structure 110 is formed next to the transistor structure 100, wherein the STI structure 110 is well-known to those of ordinary skill in the art, so further description thereof is omitted for simplicity. The gate 101 is formed on a dielectric 111, wherein the dielectric 111 is formed on or above a silicon surface 113 of a substrate 112. In addition, a cap structure 115 can be formed on the gate 101. The spacer 103 is formed on or above the silicon surface 113 and includes a first part 1031 and a second part 1032, wherein the first part 1031 covers a left-sidewall of the gate 101, and the second part 1032 covers a right-sidewall of the gate 101. In addition, in one embodiment the spacer 103 includes 3 layers, wherein the 3 layers are a thin oxide layer, a nitride layer, and an oxide layer, respectively. But, the present invention is not limited to the spacer 103 being the 3-layer spacer. That is, the spacer 103 can be single or multiple dielectric layers including nitride, oxide, nitride/oxide, or other dielectric materials. The channel region 105 is formed under the gate 101 and the spacer 103, and the channel region 105 is aligned with the spacer 103. Because of the spacer 103, a length of the channel region 105 is larger than a length of the gate 101. In another embodiment of the present invention, the channel region 105 is not fully under the gate 101 and the spacer 103. That is, at least part of the channel 105 is under the gate 101 and the spacer 103. The length of the channel region 105 is adjustable according to the length of the spacer 103 and the length of the gate 101. Moreover, a doping could be formed in the channel region 105. Optionally, it may be possible to form lightly doping region between the gate 101 and the first conductive region 107 and/or between the gate 101 and the second conductive region 109.

The first conductive region 107 is formed and contacted with a sidewall of a first concave 117, and the first conductive region 107 includes a lower part 1071 and a upper part which includes a first upper part 1072 and a second upper part 1073, wherein the lower part 1071 is coupled to the channel region 105, and the first upper part 1072 and the second upper part 1073 are coupled to the first part 1031 of the spacer 103. In addition, a top surface of the second upper part 1073 can be higher or lower than a top surface of the gate 101, and a thickness of the lower part 1071 (e.g. the distance from the top to the bottom of the lower part 1071, wherein the top surface of the lower part 1071 is aligned with the silicon surface 113) is greater than a thickness of the channel region 105 (e.g. the distance from the top to the bottom of the channel region 105), as shown in FIG. 1A. In addition, in another embodiment of the present invention, a height of the first conductive region 107 is greater than the length of the gate 101 along the silicon surface 113, or greater than a sum of the length of the gate 101 and a length of the spacer 103 along the silicon surface 113. In addition, the first conductive region 107 can include silicon containing materials such as silicon, silicon-carbide (SiC), or silicon-germanium (SiGe).

A first insulation layer 119 is formed in the first concave 117 and covers a bottom surface of the first concave 117, wherein the first insulation layer 119 is formed under the lower part 1071. A second insulation layer 121 is formed next to the first conductive region 107 and covers a sidewall of the lower part 1071 and a sidewall of the first upper part 1072. In addition, the material of the first insulation layer 119 and/or the second insulation layer 121 can be oxide, nitride, or other insulation materials. In one embodiment of the present invention, the first insulation layer 119 and/or the second insulation layer 121 could be formed by thermal oxidation. In another example, the first insulation layer 119 and the second insulation layer 121 are formed by an atomic-layer-deposition (ALD) or chemical vapor deposition (CVD) technique.

Moreover, a conductive region 133 is partially formed in the first concave 117 as well, wherein the conductive region 133 is included by a neighborhood transistor structure next to the transistor structure 100, and the conductive region 133 could be separated and electrically isolated from the first conductive region 107 by the second insulation layer 121 or other separating methods. In another example, the conductive region 133 and the first conductive region 107 are formed and connected together such that there is a "collar" shape conductive region formed in the first concave 117, and the structure next to the transistor structure 100 could be a dummy structure or another transistor.

In addition, the first conductive region 107 is coupled to a contact region 123 through the second upper part 1073, wherein the contact region 123 is used for future interconnections of the transistor structure 100. Due to the second insulation layer 121, the lower part 1071 and the first upper part 1072 are separated from the contact region 123 by the second insulation layer 121. In addition, the contact region 123 can include heavily doped polysilicon or metal containing materials. In such case, even the conductive region 133 is physically separated from the first conductive region 107, the conductive region 133 is electrically coupled to the first conductive region 107 through the contact region 123.

The first conductive region 107 has a first doping concentration profile along a first extension direction of the first conductive region 107, wherein the first extension direction extends upward from the lower part 1071 to the second upper part 1073. That is, the first extension direction is parallel (or substantially parallel) to a normal direction of the silicon surface 113. Specifically, the first doping concentration profile includes doping concentrations of the lower part 1071, the first upper part 1072, and the second upper part 1073. In one example, the doping concentration of the first upper part 1072 and/or the second upper part 1073 is higher than the doping concentration of the lower part 1071. However, the present invention is not limited to the above example, that is, the first doping concentration profile can be other doping distribution profile, such as any sequence of the combination of the lightly doping, normal doping, and heavily doping.

In addition, a resistance of the first conductive region 107 can be controlled by adjusting the first doping concentration profile thereof. That is, for example, when an on current of the transistor structure 100 flows from the first conductive region 107 to the channel region 105, a value of the on current is also dependent on the first doping concentration profile of the first conductive region 107. By controlling the resistance of the first conductive region 107, a voltage drop on the first conductive region 107 can be reduced or changed. Moreover, as shown in FIG. 1A, the length of the channel region 105 is larger than the length of the gate 101, and the first insulation region 119 also reduces contacting area between the first conductive region 107 and the substrate 112. Based on the above-mentioned reasons, a leakage current of the transistor structure 100 can be reduced. In addition, in another embodiment of the present invention, the resistance of the first conductive region 107 can further be controlled by the height, a width, or a length of the first conductive region 107. Moreover, in another embodiment of the present invention, the first insulation region 119 can be omitted when the leakage current of the transistor structure 100 is not a key factor for the purpose of the operation of the transistor structure 100.

Similar to the first conductive region 107, the second conductive region 109 of the transistor structure 100 is formed and contacted with a sidewall of a second concave 125 and includes a lower part 1091 and a upper part which includes a first upper part 1092 and a second upper part 1093, wherein the second conductive region 109 has a second doping concentration profile along a second extension direction of the second conductive region 109, wherein the second extension direction extends upward from the lower part 1091 to the second upper part 1093. In addition, the first doping concentration profile of the first conductive region 107 and the second doping concentration profile of the second conductive region 109 are symmetric. However, in another embodiment of the present invention, the first doping concentration profile and the second doping concentration profile are intentionally made asymmetric.

In addition, a first insulation layer 127 is formed under the second conductive region 109, a second insulation layer 129 is formed next to the second conductive region 109, and the second conductive region 109 is coupled to a contact region 131. Structures and characteristics of the second conductive region 109, the first insulation layer 127, the second insulation layer 129, and the contact region 131 can be referred to the above-mentioned structures and characteristics of the first conductive region 107, the first insulation layer 119, the second insulation layer 121, and the contact region 123, so further descriptions thereof are omitted for simplicity.

Figure 1B:
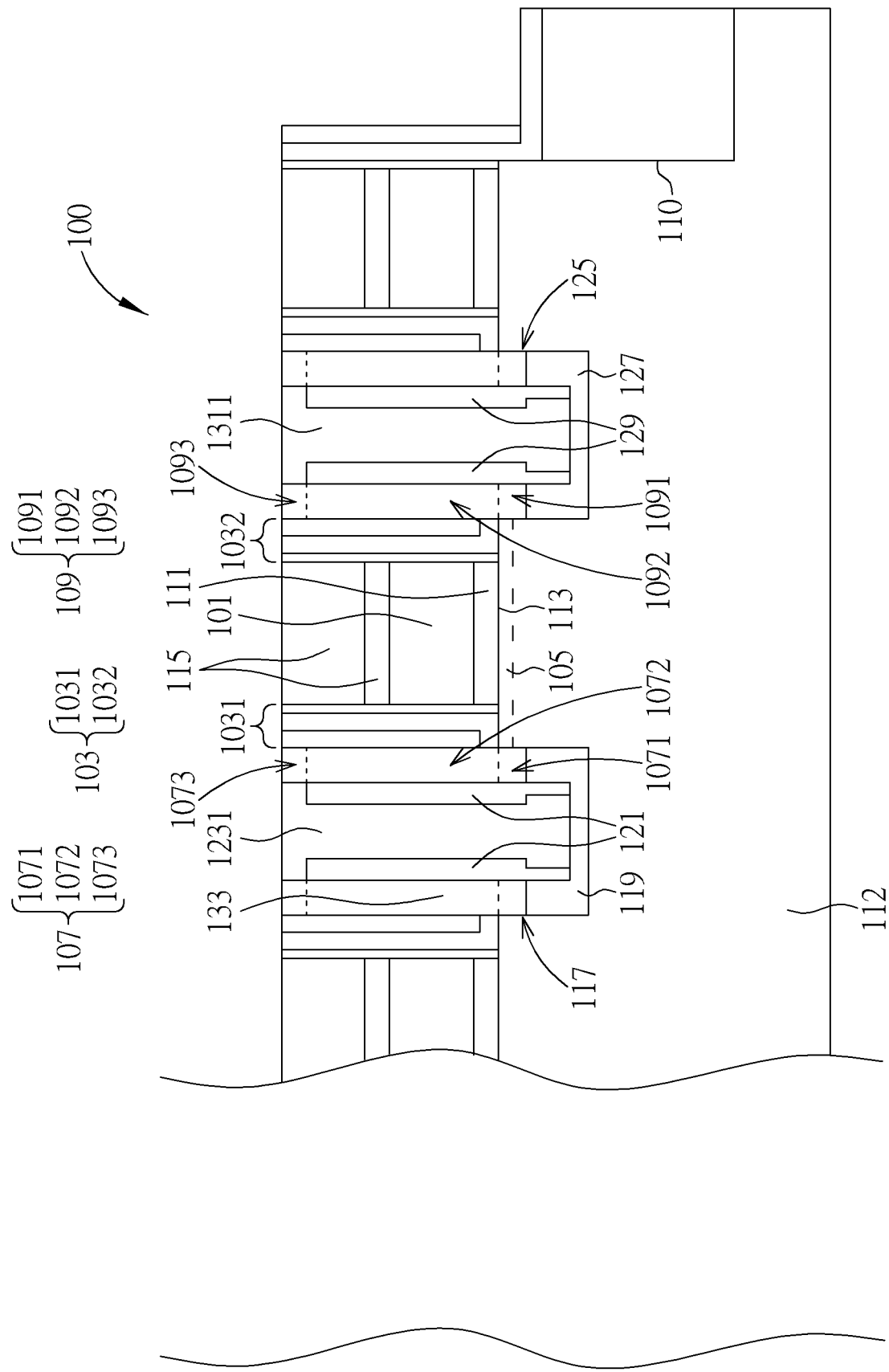
FIG. 1B is a diagram illustrating a transistor structure according to another embodiment of the present invention.

Please refer to FIG. 1B, the transistor structure in FIG. 1B is similar to that described in FIG. 1A, but the conductive region 133 of a neighborhood transistor structure is physically separated and electrically isolated from the first conductive region 107 by an isolated material 1231 and the second insulation layer 121. Moreover, the top of the first conductive region 107 and the top of the conductive region 133 could be aligned with the top of the spacer 103, such that the first conductive region 107 (or the conductive region 133) could be independently and electrically coupled to other conductive line above the transistor structure. Similarly, another conductive region of another neighborhood transistor structure is physically separated and electrically isolated from the second conductive region 109 by another isolated material 1311 and the second insulation layer 129, and the second conductive region 109 could be independently and electrically coupled to another conductive line as well.

Figure 2:
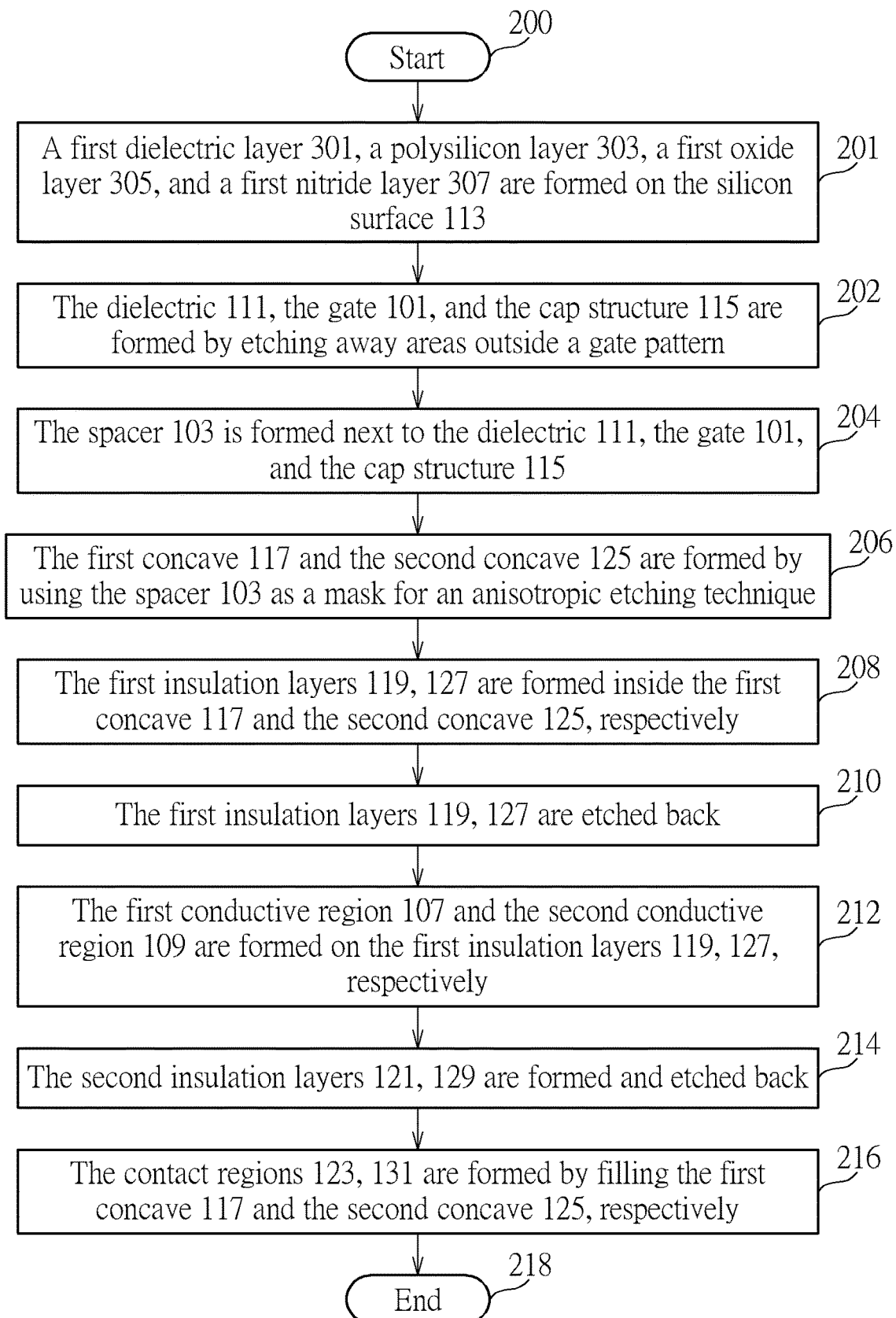
FIG. 2 is a flowchart illustrating a manufacturing method of the transistor structure according to a second embodiment of the present invention.

Please refer to FIGS. 2, 3, 4, 5, 6A, 6B, 7, 8, 9, 10A, 10B, 11. FIG. 2 is a flowchart illustrating a manufacturing method of the transistor structure 100 according to a second embodiment of the present invention. The manufacturing method in FIG. 2 is illustrated using FIGS. 3, 4, 5, 6A, 6B, 7, 8, 9, 10A, 10B, 11, wherein FIGS. 3, 4, 5, 6A, 6B, 7, 8, 9, 10A, 10B, 11 also show the neighborhood transistor structure (or neighborhood dummy structure) next to the transistor structure 100, but structures thereof are not labeled in FIGS. 3, 4, 5, 6A, 6B, 7, 8, 9, 10A, 10B, 11 for simplicity. Detailed steps are as follows:

Step 200: Start.
Step 201: A first dielectric layer 301, a polysilicon layer 303, a first oxide layer 305, and a first nitride layer 307 are formed on the silicon surface 113.
Step 202: The dielectric 111, the gate 101, and the cap structure 115 are formed by etching away areas outside a gate pattern.
Step 204: The spacer 103 is formed next to the dielectric 111, the gate 101, and the cap structure 115.
Step 206: The first concave 117 and the second concave 125 are formed by using the spacer 103 as a mask for an anisotropic etching technique.
Step 208: The first insulation layers 119, 127 are formed inside the first concave 117 and the second concave 125, respectively.
Step 210: The first insulation layers 119, 127 are etched back.
Step 212: The first conductive region 107 and the second conductive region 109 are formed on the first insulation layers 119, 127, respectively.
Step 214: The second insulation layers 121, 129 are formed and etched back.
Step 216: The contact regions 123, 131 are formed by filling the first concave 117 and the second concave 125, respectively.
Step 218: End.

Figure 3:
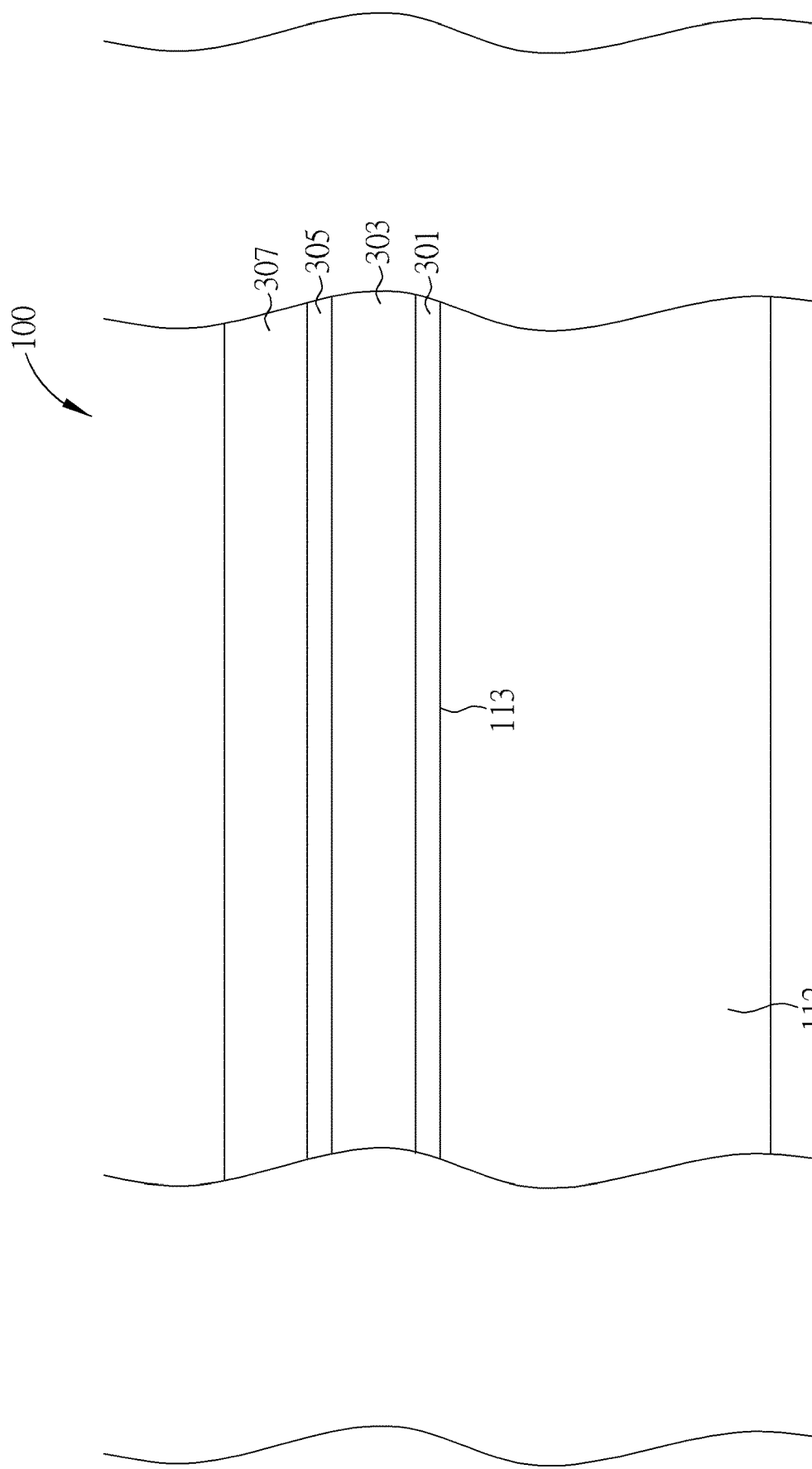
FIG. 3 is a diagram illustrating forming the first dielectric layer, the polysilicon layer, the first oxide layer, and the first nitride layer on the silicon surface.

At beginning, a STI structure 110 could be first formed in the substrate 112 by utilizing well-known processing steps, wherein a top surface of the STI structure 110 is below the silicon surface 113 for 25 nm to 30 nm, and a bottom surface of the STI structure 110 can be 300 nm to 1000 nm deeper into the substrate 112. In addition, as shown in FIG. 3, in step 201, a first dielectric layer 301 is formed on the silicon surface 113, wherein the first dielectric layer 301 can be thermally grown oxide, oxide and composite insulation material, or other high-dielectric constant (high-k) materials. Then, a polysilicon layer 303 (including doped polysilicon, polysilicon plus silicide material, metal, or other gate materials) is deposited on the first dielectric layer 301, and a first oxide layer 305 and a first nitride layer 307 are deposited on the polysilicon layer 303 in order.

Figure 4:
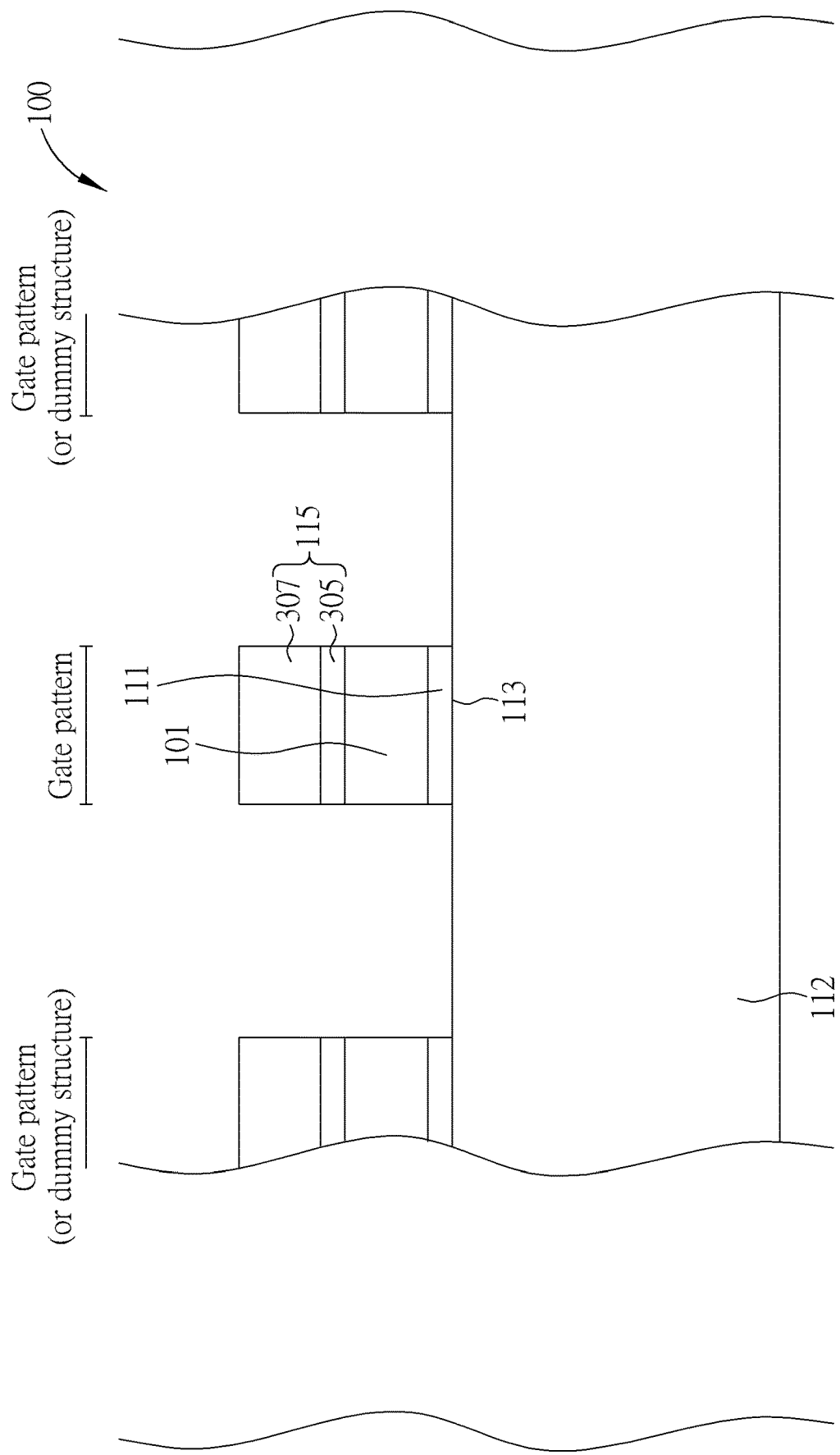
FIG. 4 is a diagram illustrating forming the dielectric, the gate, and the cap structure.

In step 202, as shown in FIG. 4, the gate pattern corresponding to the dielectric 111, the gate 101, and the cap structure 115 is defined by a lithography masking step, and the anisotropic etching technique is used for etching away the areas outside the gate pattern, wherein the dielectric 111 includes the first dielectric layer 301, the gate 101 includes the polysilicon layer 303, and the cap structure 115 includes the first oxide layer 305 and the first nitride layer 307.

Figure 5:
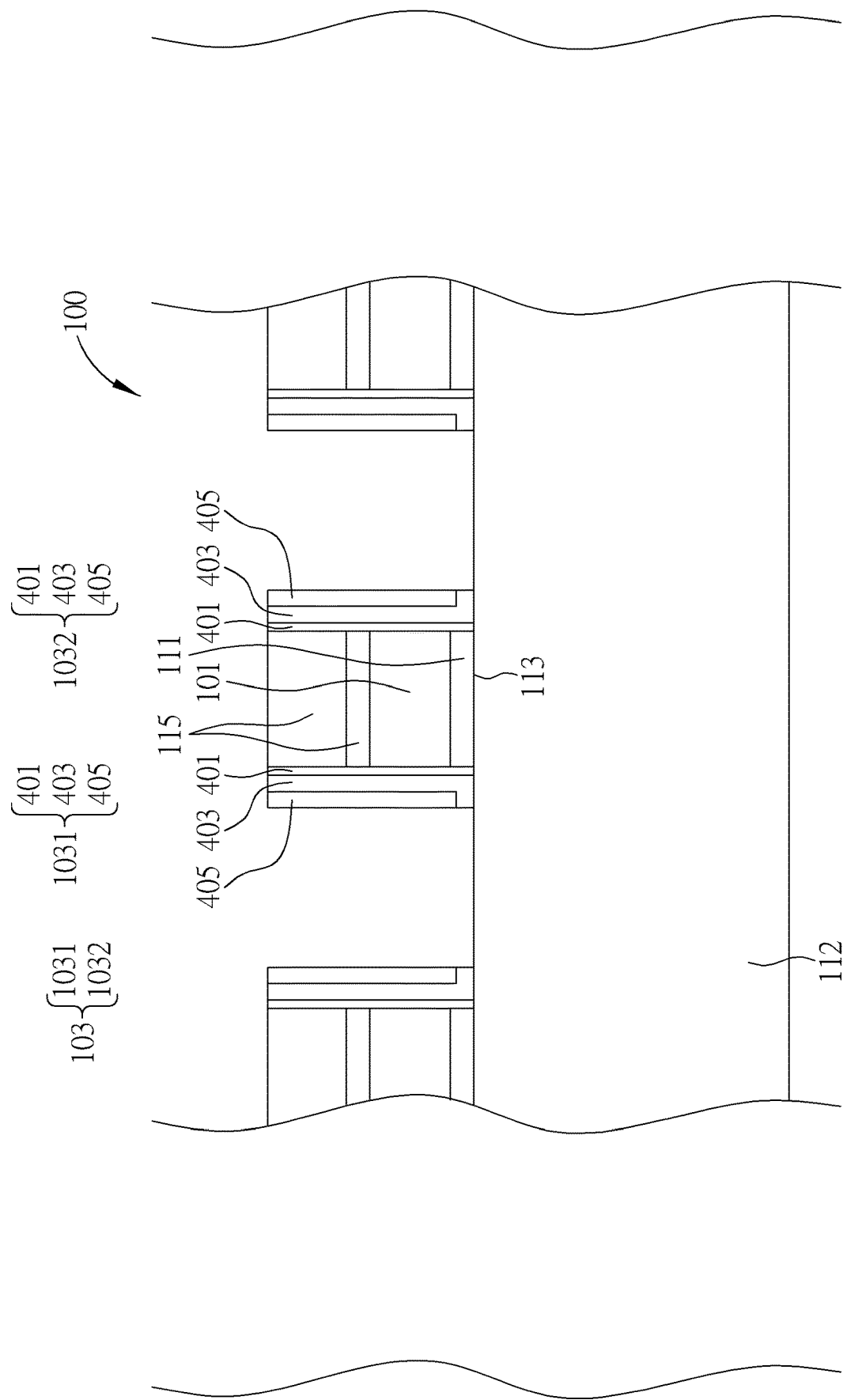
FIG. 5 is a diagram illustrating the spacer being formed next to the dielectric, the gate, and the cap structure.

In step 204, a thin oxide layer 401, a second nitride layer 403, and a second oxide layer 405 are formed in order, wherein the thin oxide layer 401 is coupled to the dielectric 111, the gate 101, and the cap structure 115, the second nitride layer 403 is coupled to the thin oxide layer 401, and the second oxide layer 405 is coupled to the second nitride layer 403. Then, as shown in FIG. 5, the spacer 103 (including the first part 1031 and the second part 1032) is formed by using the anisotropic etching technique. Of course, the spacer 103 is not limited to three-layers structure, it could include two-layer structure or other multiple-layers structure.

Figure 6A:
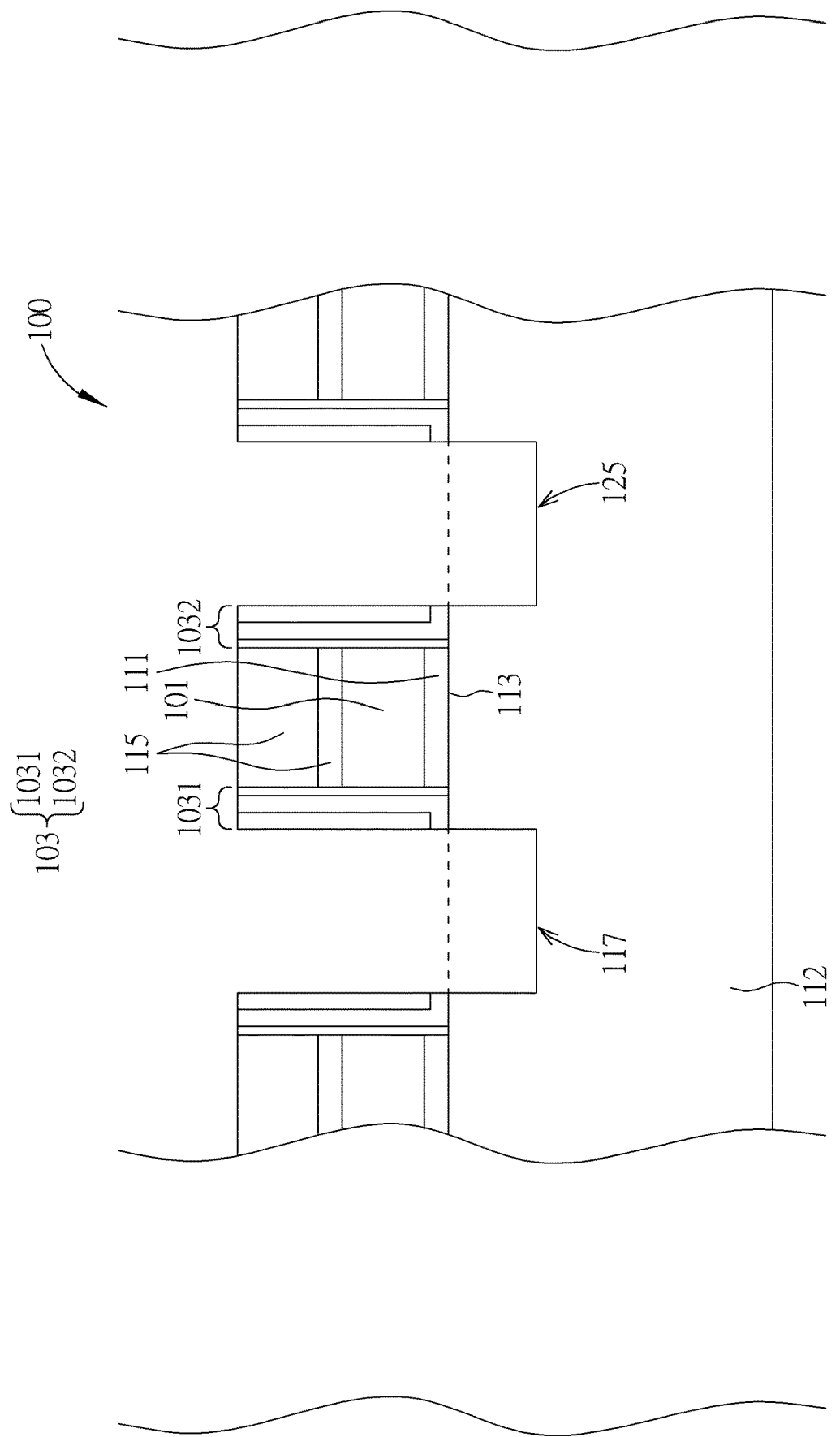
FIG. 6A is a diagram illustrating the first concave and the second concave being formed by using the spacer as a mask for an anisotropic etching technique.

In step 206, as shown in FIG. 6A, the first concave 117 and the second concave 125 are formed by etching technique (such as anisotropic etching) using the spacer 103 as a mask, and the sidewalls of the concaves 117, 125 are align with the spacer 103, wherein a depth of each of the first concave 117 and the second concave 125 can be 10 nm, or between 10 nm-30 nm. In addition, in another embodiment of the present invention, the second oxide layer and a part of the second nitride layer of the spacer 103 can further be etched to expose a part 501 (shown in FIG. 6B) of the silicon surface 113, wherein the part 501 is on top of the sidewalls of the concaves 117, 125, resulting in the sidewalls of the concaves 117, 125 being not aligned with the spacer 103.

Figure 6B:
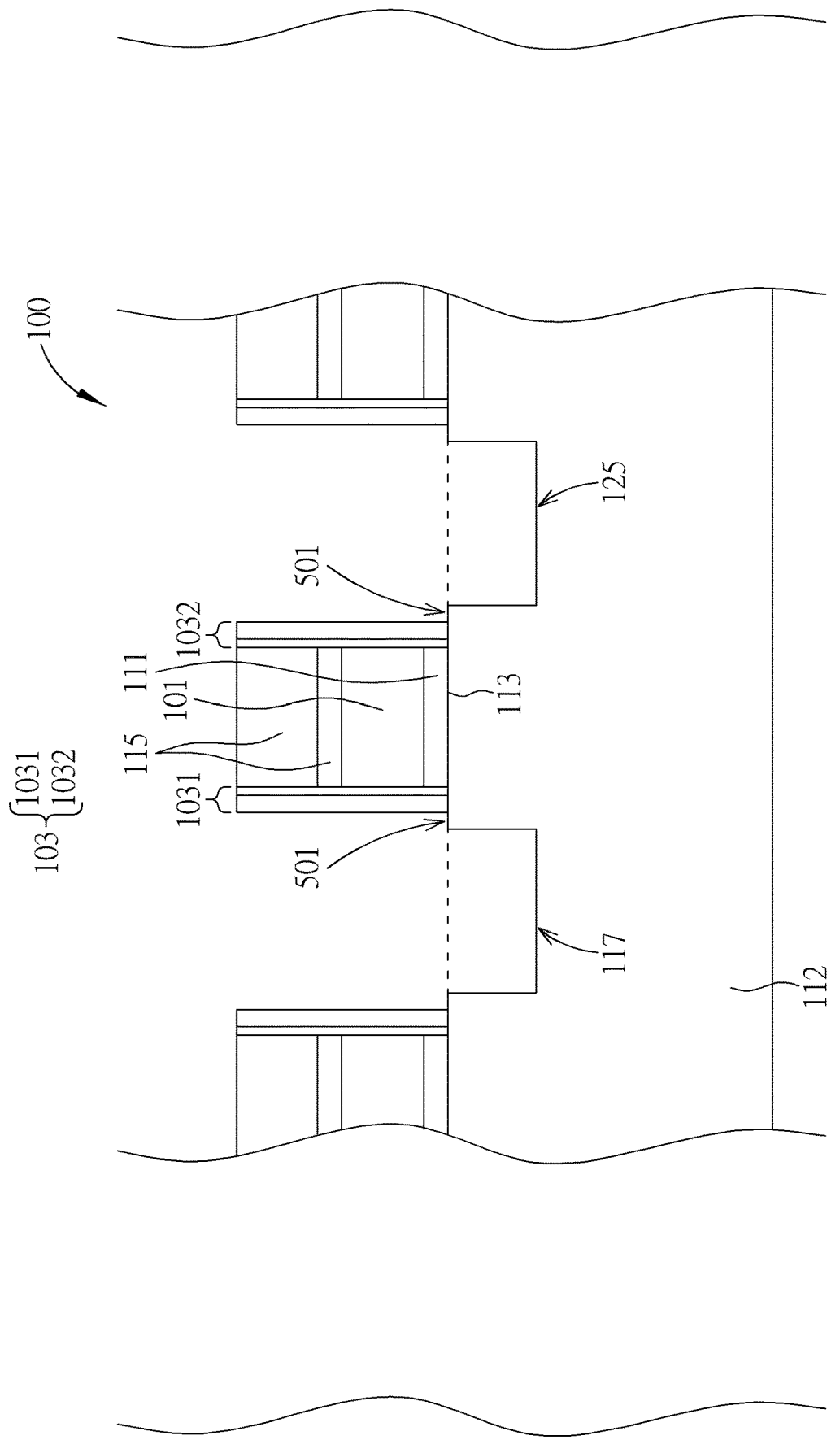
FIG. 6B is a diagram illustrating the spacer being etched back to expose a part of the silicon surface according to another embodiment of the present invention.
Figure 10A:
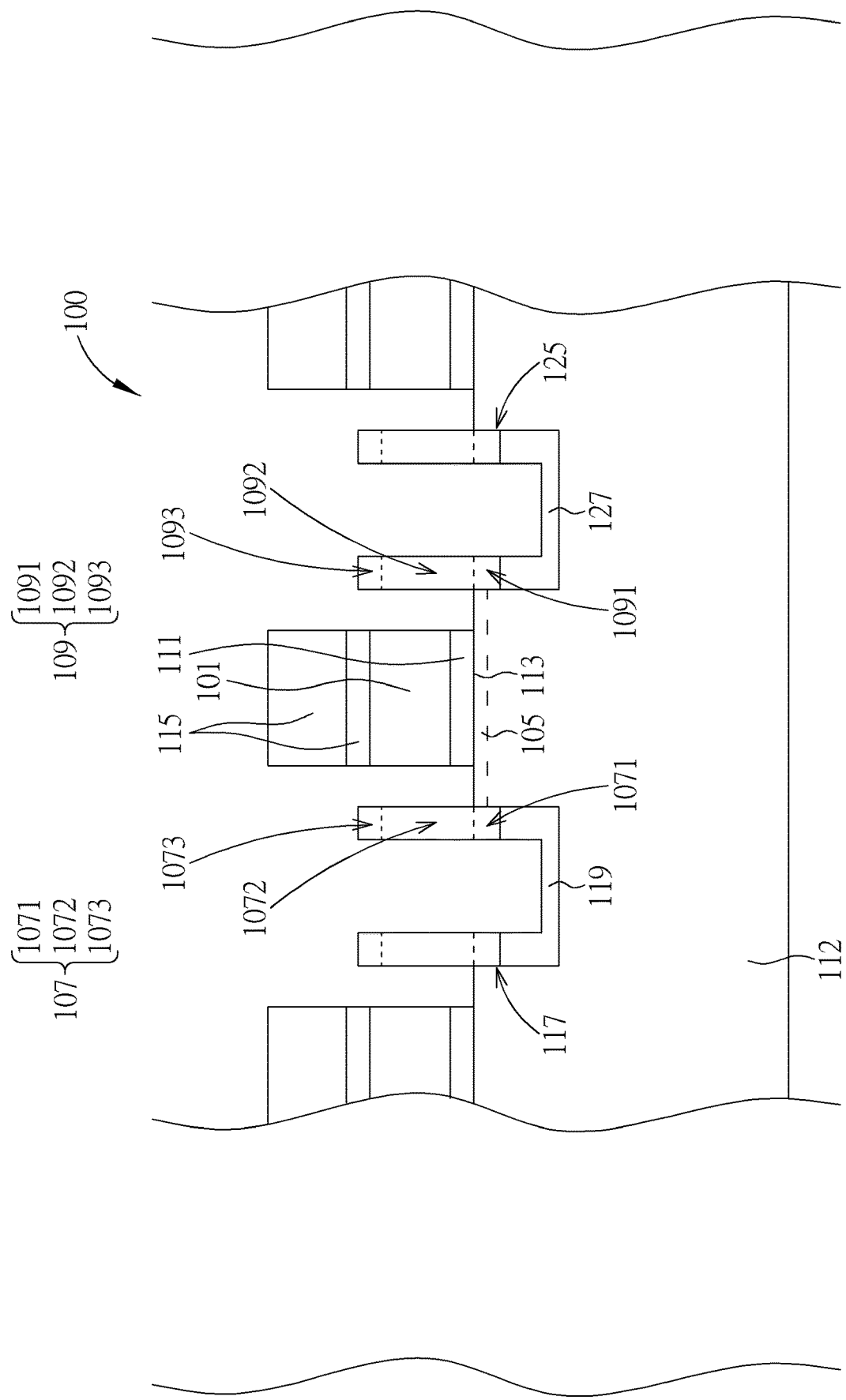
FIG. 10A is a diagram illustrating the spacer being removed according to another embodiment of the present invention.
Figure 10B:
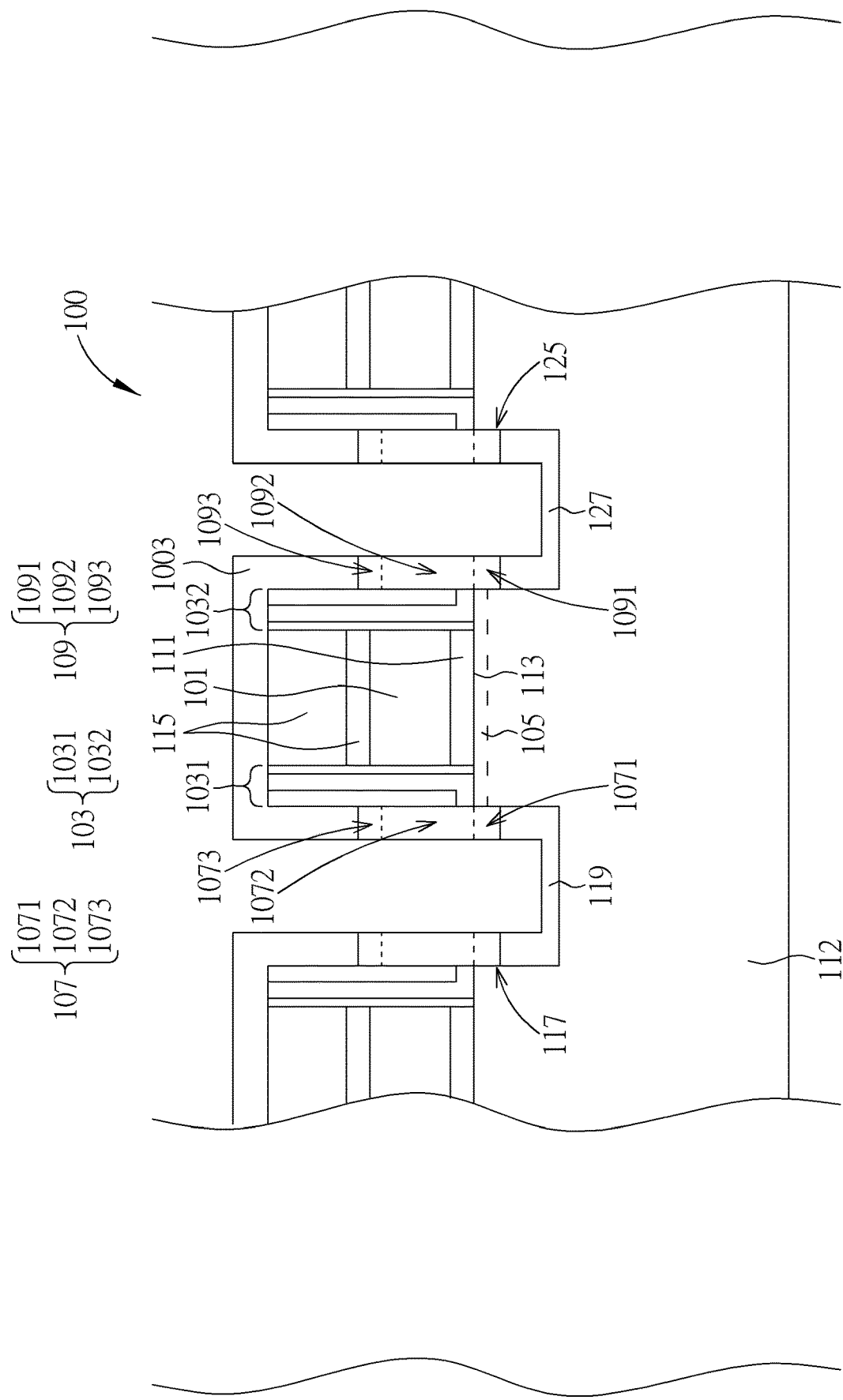
FIG. 10B is a diagram illustrating a second dielectric layer being formed on the spacer, the cap structure, the first conductive region, and the second conductive region according to another embodiment of the present invention.
Figure 11:
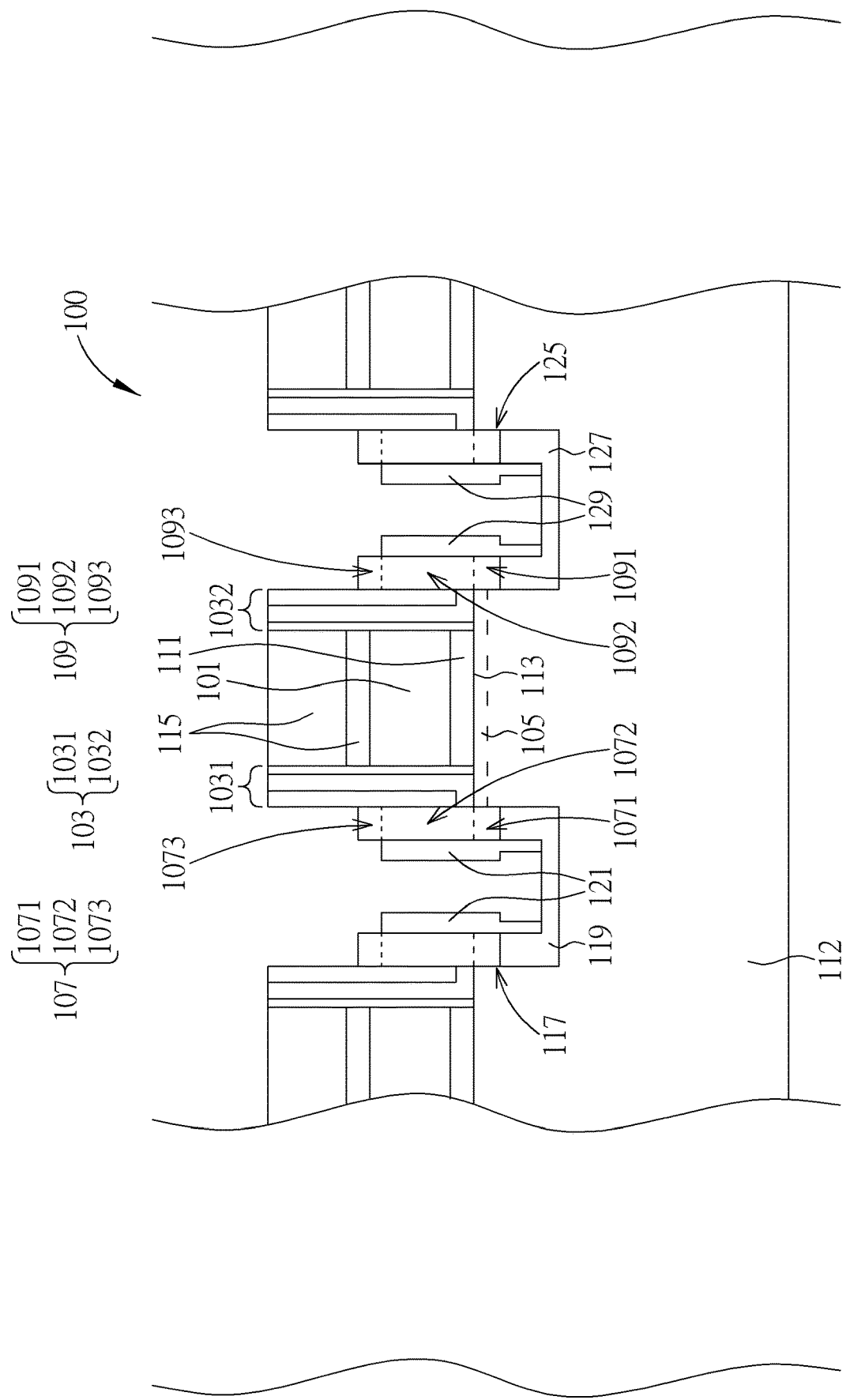
FIG. 11 is a diagram illustrating the second insulation layers being formed and etched back.
Figure 12A:
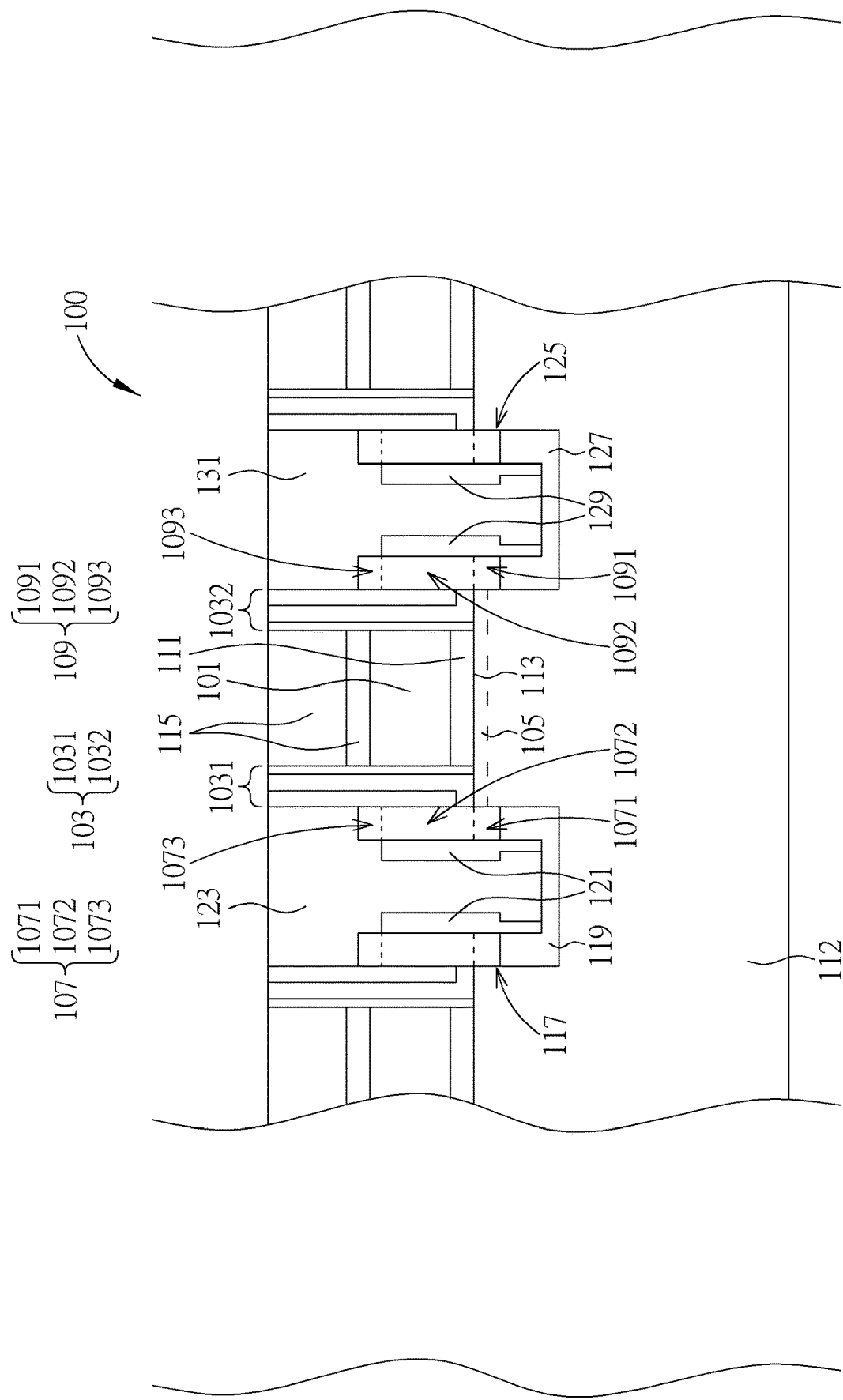
FIG. 12A is a diagram illustrating a final structure of the transistor structure.
Figure 12B:
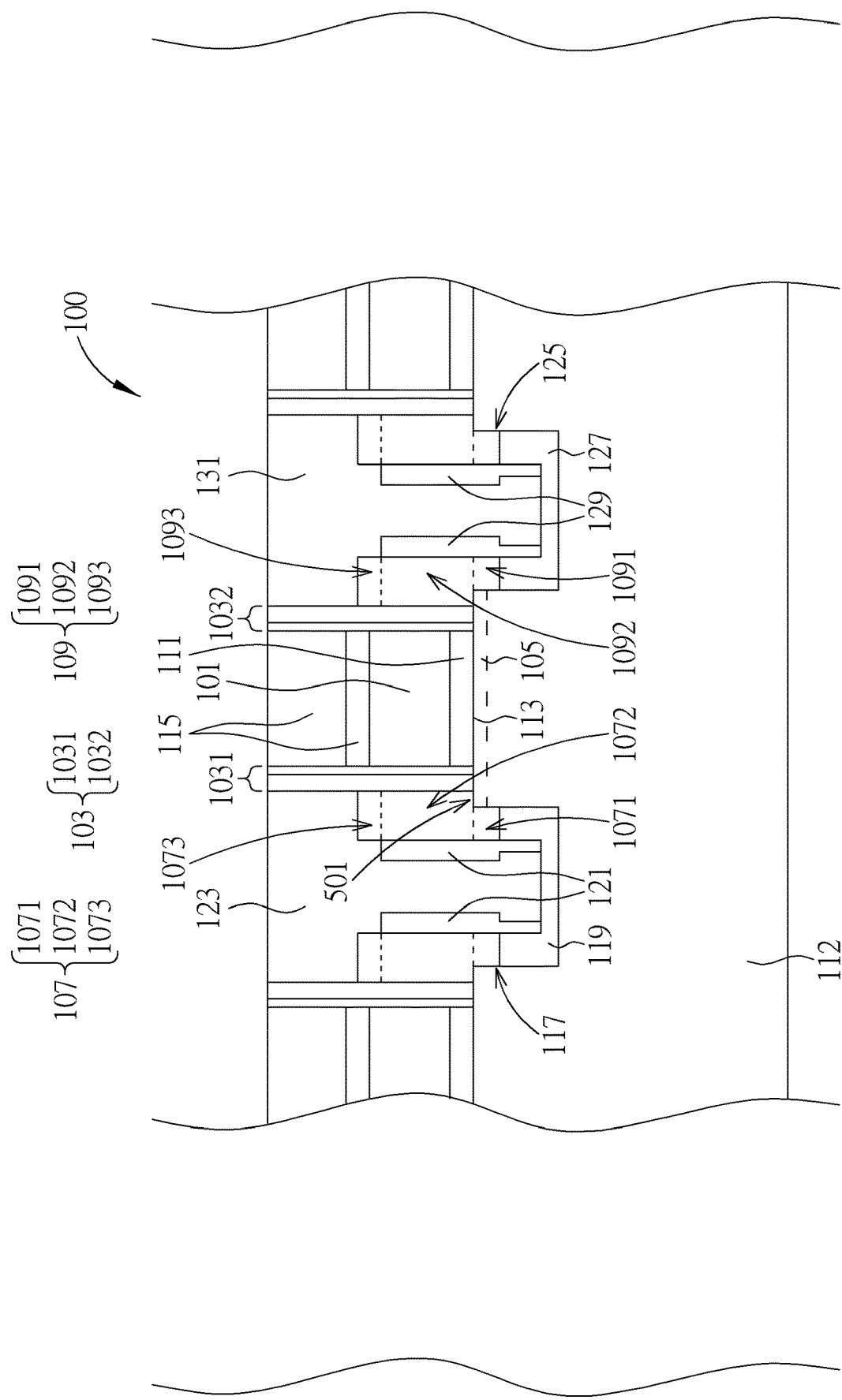
FIG. 12B is a diagram illustrating a final structure of the transistor structure according to the embodiment shown in FIG. 6B.

Following steps of the manufacturing method shown in FIGS. 7~9, 10A, 10B, 11 and 12A are explained based on the structure shown FIG. 6A, and FIG. 12B is explained based on the structure shown in FIG. 6B.

Figure 7:
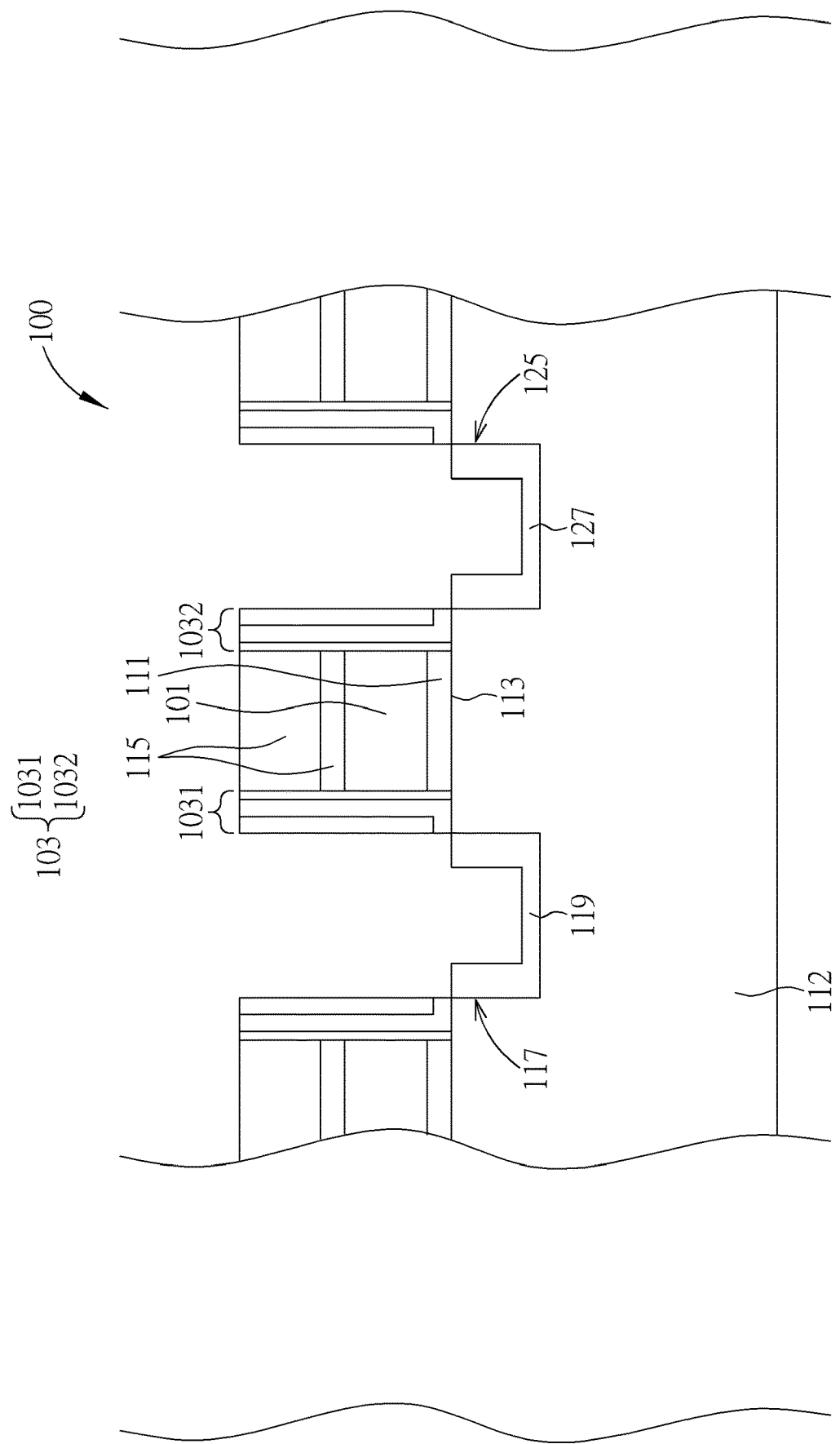
FIG. 7 is a diagram illustrating the first insulation layers being formed inside the first concave and the second concave.

In step 208, as shown in FIG. 7, the first insulation layers 119 is formed inside the first concave 117 and covers sidewalls and a bottom of the first concave 117. Similarly, the first insulation layers 127 is formed inside the second concave 125 and covers sidewalls and a bottom of the second concave 125. In addition, the first insulation layers 119, 127 can be thermally grown oxide, deposited oxide, deposited composite insulation material or other high-k materials.

Figure 8:
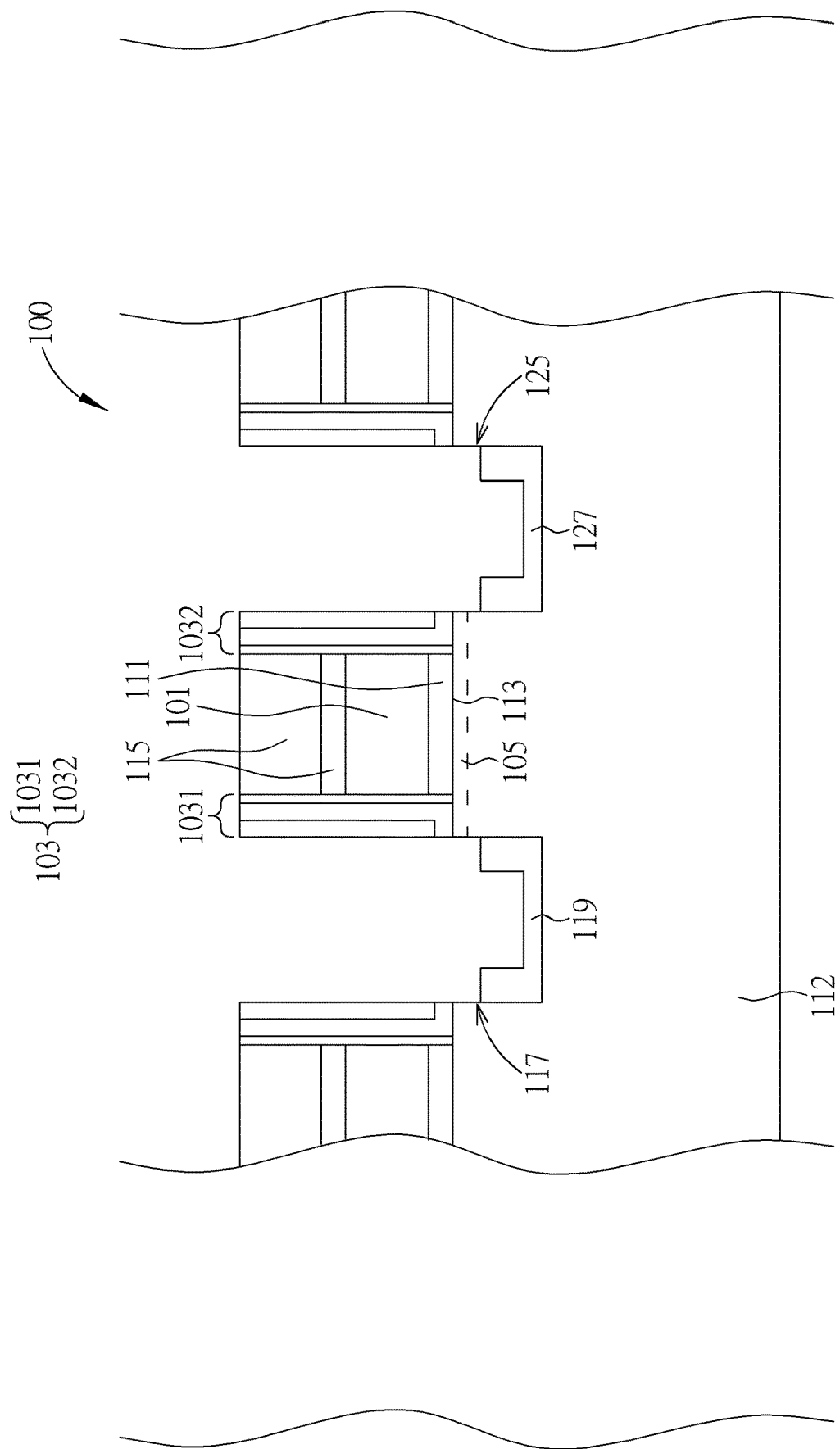
FIG. 8 is a diagram illustrating the first insulation layers being etched back.

In step 210, as shown in FIG. 8, parts of the first insulation layers 119, 127 are etched back to make top surfaces of the first insulation layers 119, 127 lower than the silicon surface 113. Therefore, the sidewalls of the silicon channel 105 are exposed.

Figure 9:
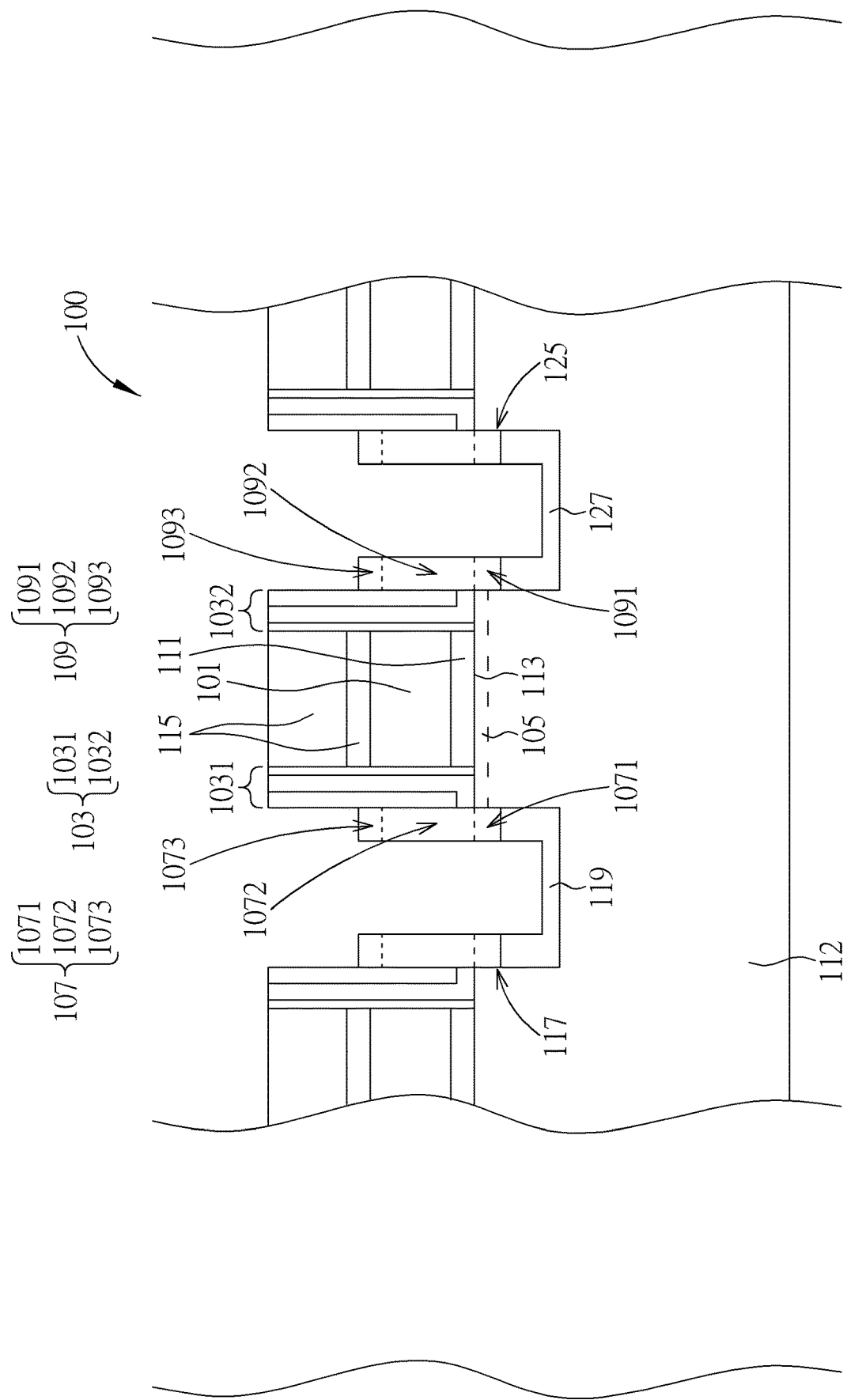
FIG. 9 is a diagram illustrating the first conductive region and the second conductive region being formed on the first insulation layers.

In step 212, as shown in FIG. 9, the first conductive region 107 is formed and contacted with the sidewall of the first concave 117, and is positioned on the first insulation layer 119. Similarly, the second conductive region 109 is formed and contacted with the sidewall of the second concave 125, and is positioned on the first insulation layer 127. In one embodiment of the present invention, the first conductive region 107 and the second conductive region 109 are formed by a deposition technique (e.g. the ALD or CVD technique). However, in another embodiment of the present invention, the first conductive region 107 and the second conductive region 109 are grown by a selective-epitaxy-growth (SEG) technique. Specifically, the SEG technique can use a left-sidewall of the silicon channel 105 as a silicon-growth seeding to grow a single-crystalline silicon layer partially on the sidewall of the first concave 117 as the lower part 1071 of the first conductive region 107, and then continuously use the SEG technique to grow the rest of the first conductive region 107 based on the lower part 1071. During the SEG growth, the first doping concentration profile of the first conductive region 107 could be controlled. Similarly, the SEG technique can use a right-sidewall of the silicon channel 105 as the silicon-growth seeding to grow the single-crystalline silicon layer partially on the sidewall of the second concave 125 as the second conductive region 109.

In addition, each part of the lower part 1071, the first upper part 1072, and the second upper part 1073 can be deposited (or grown) by different mechanisms (e.g. by using different doping concentrations or using mixtures of other non-silicon materials such as Germanium or Carbon atoms, etc.) to make the first conductive region 107 have the first doping concentration profile. Similarly, each part of the lower part 1091, the first upper part 1092, and the second upper part 1093 can be deposited (or grown) by the different mechanisms to make the second conductive region 109 have the second doping concentration profile. In addition, in another embodiment of the present invention, the first conductive region 107 and the second conductive region 109 can be treated by a laser-annealing technique (or a rapid thermal-annealing technique, or other annealing techniques) to improve qualities and stabilities of the first conductive region 107 and the second conductive region 109. In addition, how to design shapes of the first conductive region 107 and the second conductive region 109 depends on how the resistances and voltage/electric-field distribution effects of the first conductive region 107 and the second conductive region 109 are desired, wherein the shape/resistances of the first conductive region 107 or the second conductive region 109 can effectively control the on/off current of the transistor structure 100.

In addition, in another embodiment of the present invention, the first conductive region 107 and the second conductive region 109 can include the silicon containing materials (e.g. silicon, SiC, or SiGe) to produce a stress to improve mobility of the channel region 105. Moreover, when the first conductive region 107 and the second conductive region 109 contain SiC, the spacer 103 can be removed to improve the stress, as shown in FIG. 10A. However, in another embodiment of the present invention, a high stress dielectric film 1003 (such as SiN, as shown in FIG. 10B) can be formed on the spacer 103, the cap structure 115 and/or the first conductive region 107/the second conductive region 109.

In step 214, as shown in FIG. 11, the second insulation layers 121, 129 are formed and then etched back to make the second insulation layer 121 to cover the lower part 1071 and the first upper part 1072 of the first conductive region 107, and to make the second insulation layer 129 to cover the lower part 1091 and the first upper part 1092 of the second conductive region 109. In addition, the second insulation layers 121, 129 can be thermally grown oxide, oxide and composite insulation material or other high-k materials. As shown in FIG. 11, the second upper part 1073 of the first conductive region 107 is not covered by the second insulation layer 121, and the second upper part 1093 of the second conductive region 109 is not covered by the second insulation layer 129.

In step 216, the contact regions 123, 131 are formed by filling the first concave 117 and the second concave 125 with n+ polysilicon materials, p+ polysilicon materials, metals or other conductive material. Wherein in one example, the top surfaces of the contact regions 123, 131 are aligned with a top surface of the cap structure 115. Therefore, a final structure of the transistor structure 100 is shown in FIG. 12A. Of course, in another example, the top surfaces of the contact regions 123, 131 could be higher than the top surface of the cap structure 115. In addition, FIG. 12B is a final structure of the transistor structure 100 according to the embodiment shown in FIG. 6B. As shown in FIG. 12B, because the spacer 103 are etched back to expose the part 501 of the silicon surface 113, the part 501 on the silicon surface 113 can also be used as the silicon-growth seeding to grow the first conductive region 107 and the second conductive region 109 vertically above the part 501 on the silicon surface 113.

Figure 13:
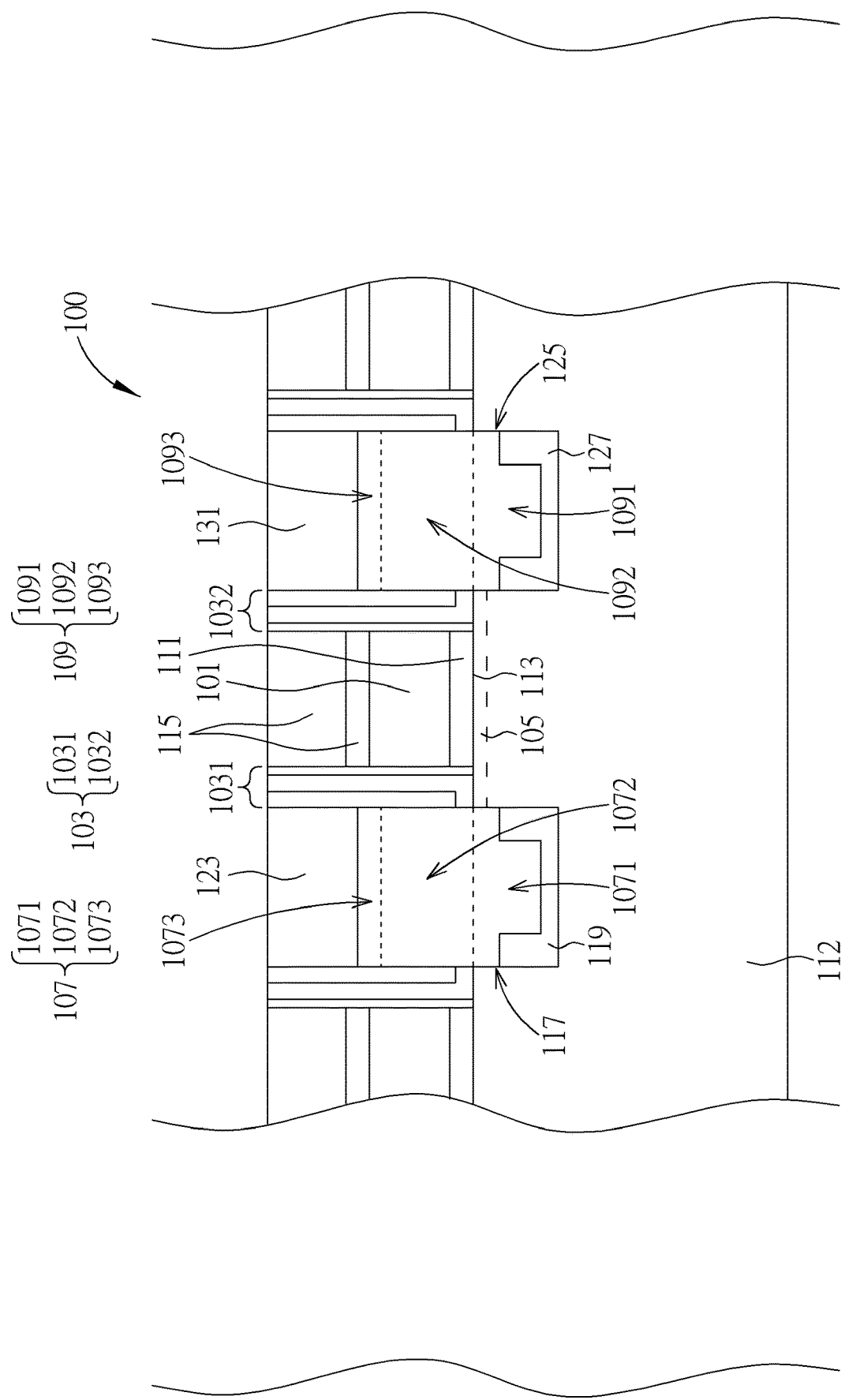
FIG. 13 is a diagram illustrating the first conductive region and the second conductive region being entirely formed in the first concave and the second concave respectively according to another embodiment of the present invention.

In another embodiment of the present invention, there is no need to form the first insulation layers 119, 127, that is, the step 208 can be omitted. In addition, as shown in FIG. 13, in another embodiment of the present invention, the parts of first conductive region 107 and the second conductive region 109 which are under the silicon surface 113 can be entirely formed in the first concave 117 and the second concave 125, respectively. That is, the second insulation layers 121, 129 can be omitted. Furthermore, the doping concentration profiles of the first conductive region 107 and the second conductive region 109 could be controlled, as mentioned in the above.

Figure 14:
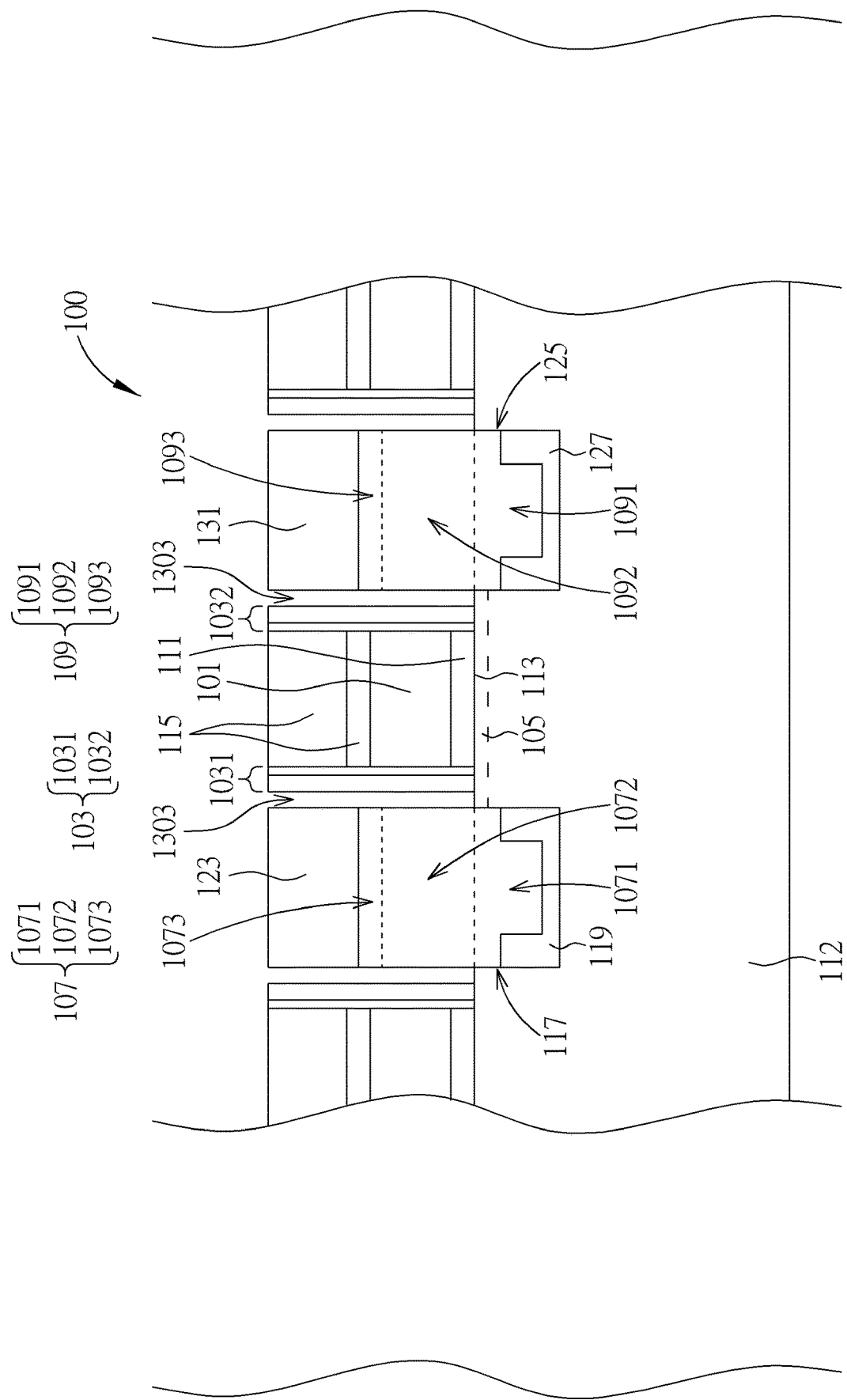
FIG. 14 is a diagram illustrating the second oxide layer of the spacer being removed according to another embodiment of the present invention.
Figure 15:
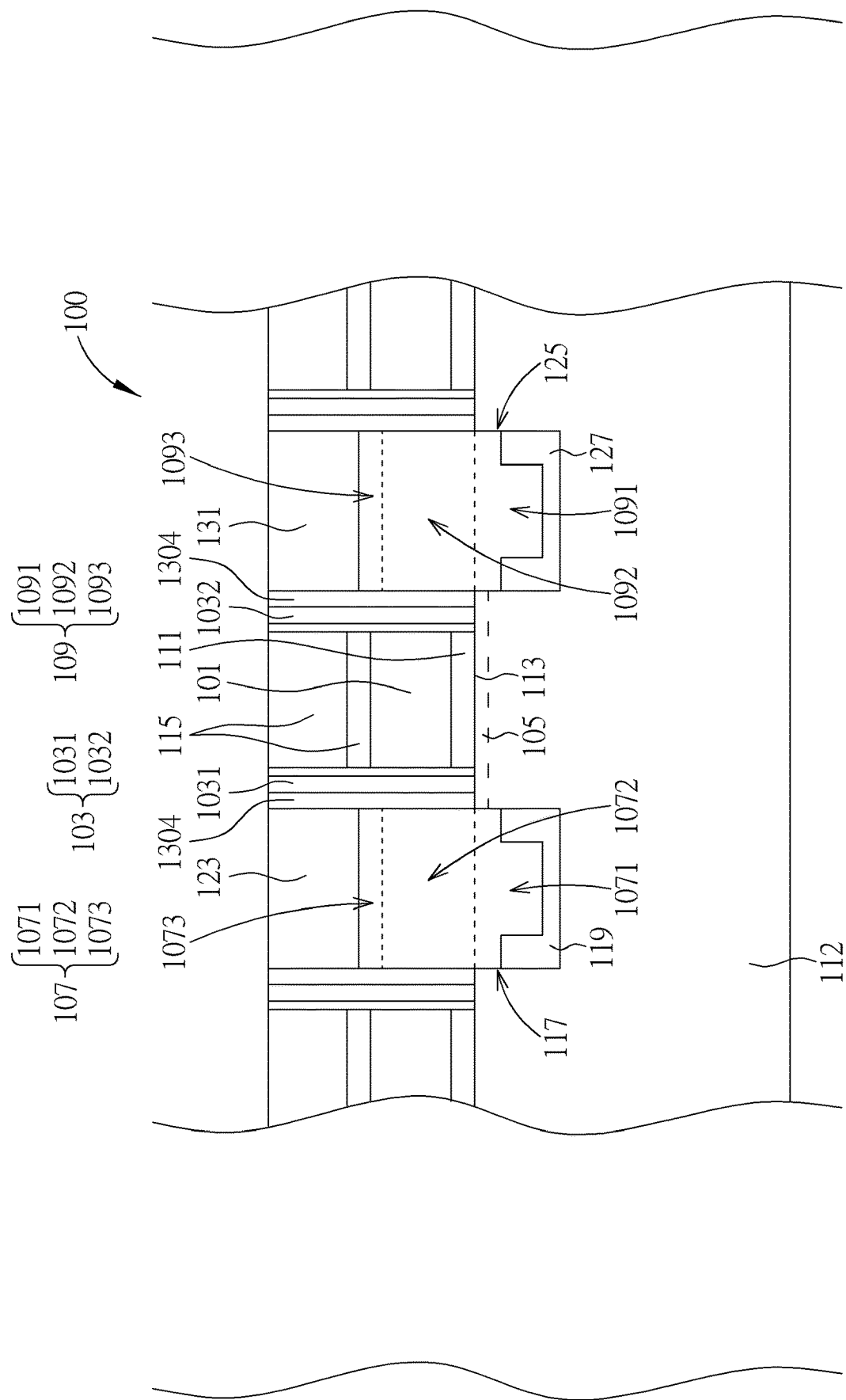
FIG. 15 is a diagram illustrating a third oxide layer being regrown according to another embodiment of the present invention.

In addition, as shown in FIG. 14, in another embodiment of the present invention, the second oxide layer of the spacer 103 can be removed to reveal gaps 1303, and a third oxide or insulating layer 1304 (shown in FIG. 15) can be formed or regrown in the gaps 1303 to improve an interface quality between the first conductive region 107 and the spacer 103 and an interface quality between the second conductive region 109 and the spacer 103. In addition, the re-growth of spacer illustrated in FIGS. 14, 15 are not limited to the embodiment structure shown in FIG. 13, it could be used in the embodiment structure in FIG. 12A or 12B. Moreover, in another embodiment of the present invention, the polysilicon layer 303 (corresponding to the gate 101) used for the gate-first process can be replaced with p+ doped polysilicon or other materials with an appropriate work function (from 4.0 eV to 5.2 eV) used for the gate-last process.

Figure 16:
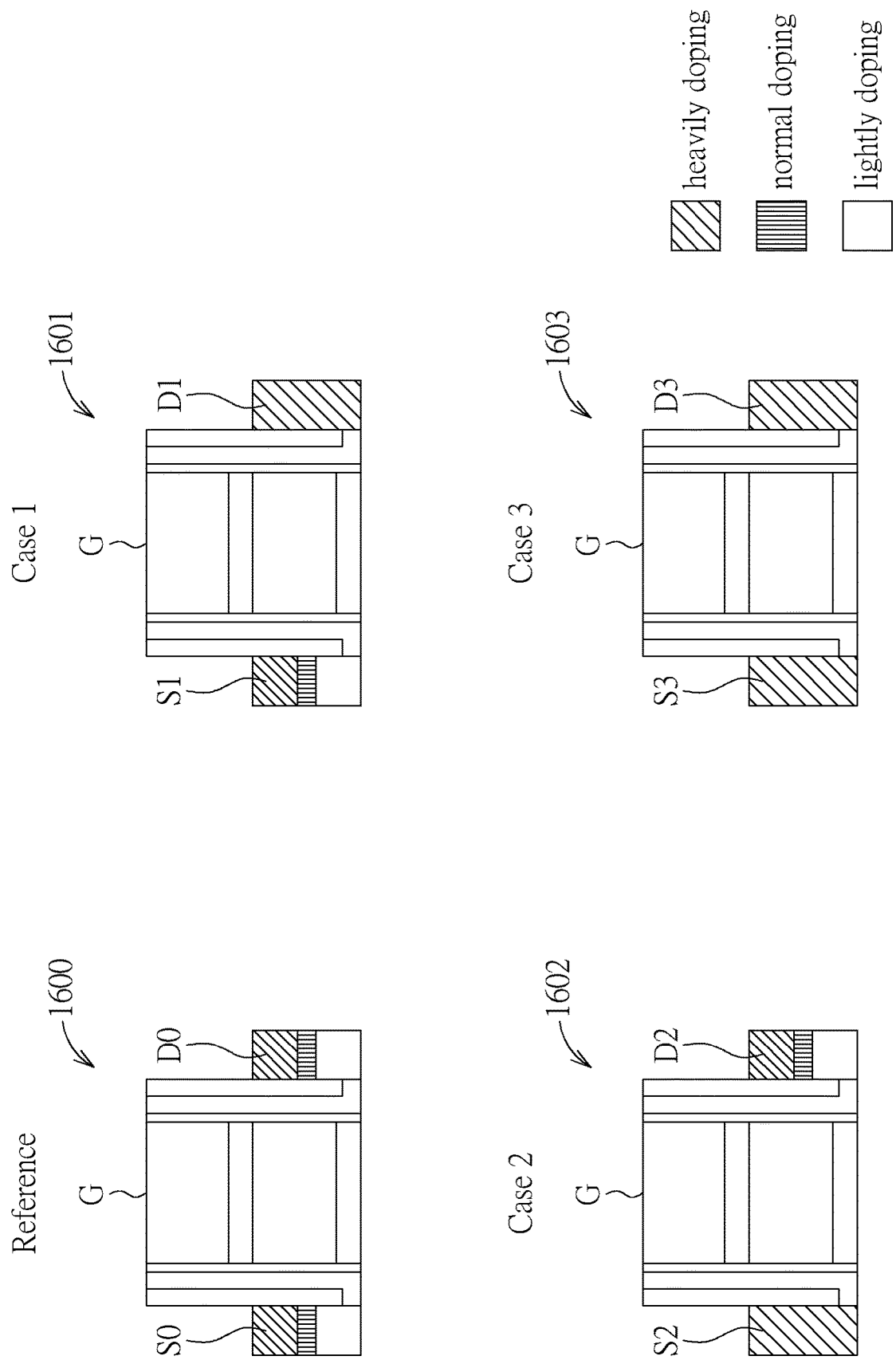
FIG. 16 is a diagram illustrating four examples of transistor structures according to another embodiment of the present invention.

In addition, in another embodiment of the present invention, the first doping concentration profile of the first conductive region 107 and the second doping concentration profile of the second conductive region 109 can be intentionally made asymmetric to improve the on current of the transistor structure 100. For example, please refer to FIG. 16, wherein FIG. 16 shows four examples of transistor structures 1600, 1601, 1602, 1603, and the transistor structures 1600, 1601, 1602, 1603 correspond to a reference, a case 1, a case 2, and a case 3, respectively. Moreover, each transistor structure of the transistor structures 1600, 1601, 1602, 1603 includes a gate structure G, the transistor structures 1600 includes a source S0 and a drain D0, the transistor structures 1601 includes a source S1 and a drain D1, the transistor structures 1602 includes a source S2 and a drain D2, and the transistor structures 1603 includes a source S3 and a drain D3, wherein the sources S0-S3 are first conductive regions and the drains D0-D3 are second conductive regions of the transistor structures 1600, 1601, 1602, 1603, respectively. For simplicity, FIG. 16 only shows the gate structure G, the source S0-S3, and the drains D0-D3 of the transistor structures 1600, 1601, 1602, 1603. In addition, the sources S0-S3 and the drains D0-D3 are shown in different marks to represent different doping concentrations, wherein designing the different doping concentrations s is a tradeoff between the requirement/application of the on current and/or the off current. Specifically, as shown in the reference and the cases 1-3, a doping concentration profile of the source S0 is the same as a doping concentration profile of the drain D0, and a doping concentration profile of the source S3 is the same as a doping concentration profile of the drain D3. However, the doping concentration profile of the source S0(D0) is different from the doping concentration profile of the source S3(D3). For example, the doping profile of source S0 includes, from bottom to top, lightly doping, normal doping, and heavily doping; and the doping profile of source S3 includes, from bottom to top, just heavily doping. On the other hand, a doping concentration profile of the source S1 (e.g., from bottom to top, lightly doping, normal doping, and heavily doping) is different from a doping concentration profile of the drain D1 (e.g., from bottom to top, just heavily doping), and a doping concentration profile of the source S2 (e.g., from bottom to top, just heavily doping) is different from a doping concentration profile of the drain D2 (e.g., from bottom to top, lightly doping, normal doping, and heavily doping). The On currents of the cases 1, 2 are higher than an on current of the reference. Generally speaking, cases with asymmetric doping concentration profiles have a higher on current than that of the reference. Moreover, in some situation the asymmetric doping concentration profiles may cause the off current to slightly increase, but a desired asymmetric doping concentration profile can be selected to make a required On current and an acceptable corresponding off current.

As previously mentioned, the first conductive region 107 and/or the second conductive region 109 may comprises silicon, SiC, or SiGe, and therefore the material of the first conductive region 107 is different from the material of the second conductive region 109, therefore, such transistor is an asymmetric transistor.

Figure 17:
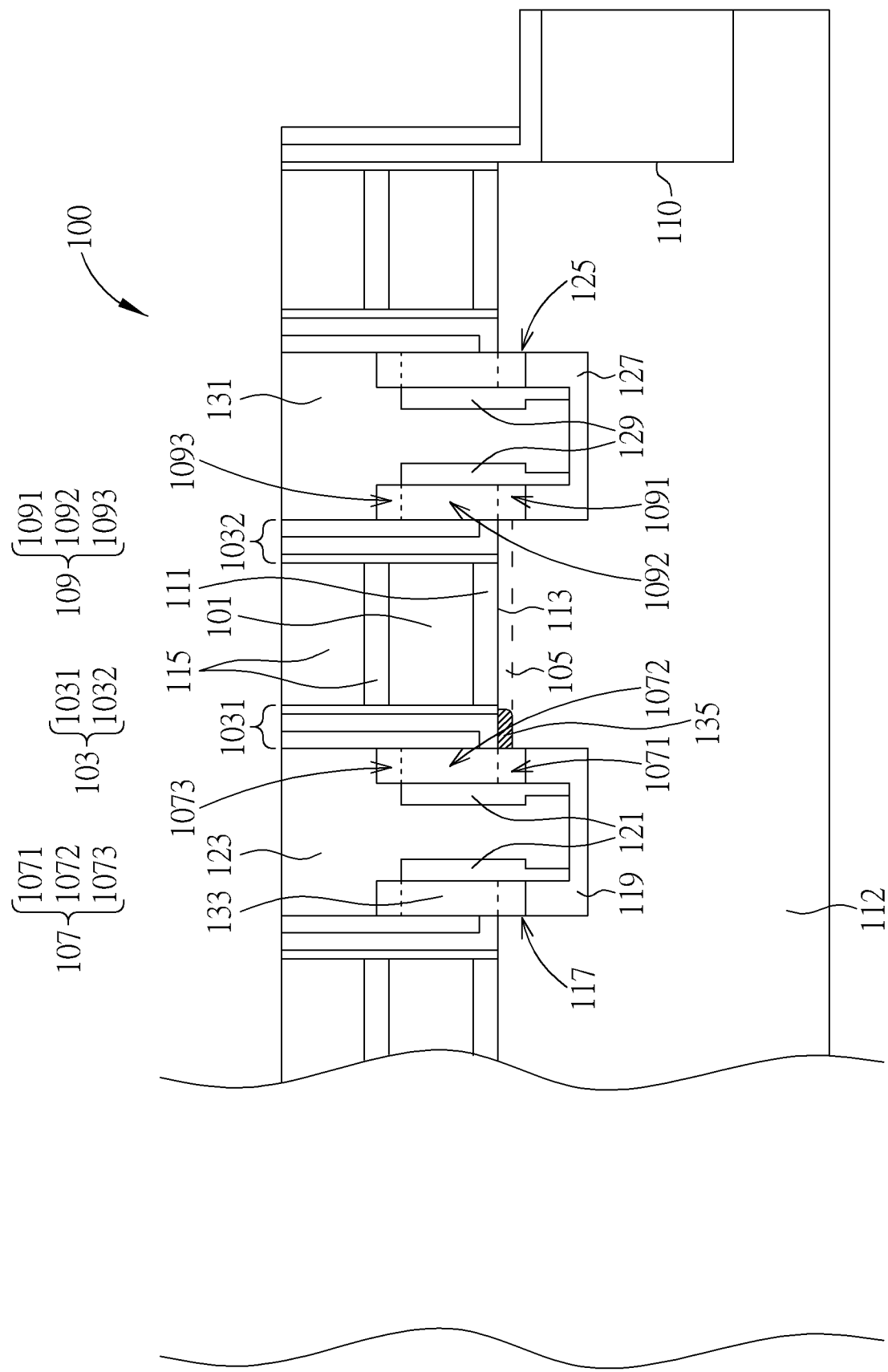
FIG. 17 is a diagram illustrating a transistor structure according to one embodiment of the present invention.

Furthermore, it is also possible to form an LDD (Lightly-Doped-Drain) zone 135 under the silicon surface, and formed between the first conductive region 107 (e.g. the drain region) and the gate by either some diffusion source (without implantation damages) or implants (later by thermal or laser annealing to remove damages) before finalization of the spacer. The LDD zone 135 is formed under the silicon surface of a substrate or a fin structure, and positioned outside the gate and/or underneath the spacer. In such situation, there is no LDD between the gate and the second conductive region 109 (e.g. the source region), as shown in FIG. 17. Of course, in another embodiment there could be an LDD zone formed between the gate and the source region, rather than between the gate and the drain region. Therefore, the structure among the gate and the source region is different from the structure among the gate and the drain region, and such transistor is an asymmetric transistor.

Moreover, the thickness of the lower part 1071 of the first conductive region 107 (that is, from the silicon surface to the bottom of the lower part 1071) could be different from the thickness of the lower part 1091 of the second conductive region 109, therefore the width of one terminal of the channel region 105 could be different from the width of another terminal of the channel region 105. Such transistor is an asymmetric transistor as well.

Please refer to FIG. 1A again, the channel region 105, the first conductive region 107, and the second conductive region 109 are made in self-alignment technique. As a result, the transistor structure 100 is more accurately controllable, has a smaller form-factor, and occupies less planar areas. In addition, because the steps of the manufacturing method of the transistor structure 100 could avoid using an ion-implantation technique to form the p-n junction between the first conductive region 107 (or the second conductive region 109) and the substrate 112, damages formed inside the p-n junction caused by the ion-implantation technique can be reduced, and a location of the p-n junction, thickness of the lower part 1071 of the first conductive region 107 (or the lower part 1091 of the second conductive region 109), and the first doping concentration profile and the second doping concentration profile are more controllable.

Moreover, in the transistor structure of the present invention, the ON/OFF current thereof will be dependent on the parameters of the first conductive region 107 (such as, the doping concentration profile, the material, the thickness of the lower part 1071 of the first conductive region 107, the thickness of the second upper part 1073 of the first conductive region 107), the parameters of the second conductive region 109, the parameter of the channel region 105 (such as the length of the channel region), the asymmetry parameters of the transistor (such as the asymmetric structures described in the aforesaid), and/or the existence of the first insulation layer/the second insulation layer, etc. Therefore, it is possible to adjust the ON/OFF current of the transistor structure based on one or any combination of the above parameters.

To sum up, the transistor structure provided by the present invention includes the gate, the spacer, the channel region, the first conductive region, and the second conductive region, wherein the first conductive region and the second conductive region are separated from the gate by the spacer. In addition, the first conductive region is formed and contacted with the sidewall of the first concave, the second conductive region is formed and contacted with the sidewall of the second concave, wherein a part of a sidewall of each conductive region of the first conductive region and the second conductive region is covered by an insulation layer, and another insulation layer could be formed on the bottom surface of the first concave, so is the bottom surface of the second concave. Therefore, compared to conventional fin-structure transistors, the leakage current of the transistor structure of the present invention can be reduced and the ON/OFF current of the transistor is adjustable based on the parameters of the transistor.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:

1. A transistor structure comprising:
    a substrate with a semiconductor surface;
    a gate above the semiconductor surface;
    a spacer above the semiconductor surface and covering a sidewall of the gate;
    a channel region, wherein at least part of the channel region is under the gate;
    a concave formed based on the semiconductor surface;
    a first insulation layer formed in the concave;
    a first conductive region electrically coupled to one terminal of the channel region, wherein the first conductive region is above the first insulation layer;
    a second conductive region electrically coupled to another terminal of channel region; and
    a metal plug filled in the concave, wherein the metal plug at least contacts to a most lateral side of the first conductive region.

2. The transistor structure in claim 1, wherein the transistor structure is an asymmetric transistor, a first doping concentration profile of the first conductive region along a first extension direction is different from a second doping concentration profile of the second conductive region along a second extension direction.

3. The transistor structure in claim 1, wherein the transistor structure is an asymmetric transistor, a structure between the gate and the first conductive region is different from a structure between the gate and the second conductive region.

4. The transistor structure in claim 1, wherein the transistor structure is an asymmetric transistor, the first conductive region comprises a first lower part under the silicon surface and the second conductive region comprises a second lower part under the silicon surface, and a thickness of the first lower part is different from a thickness of the second lower part.

5. The transistor structure in claim 1, wherein the transistor structure is an asymmetric transistor, a width of the one terminal of the channel region next to the first conductive region is different from a width of the another terminal of the channel region next to the second conductive region.

6. The transistor structure in claim 1, wherein the transistor structure is an asymmetric transistor, a material of the first conductive region is different from a material of the second conductive region.

7. A transistor structure comprising:
    a substrate with an original surface;
    a channel region;
    a gate region above the channel region;
    a shallow trench isolation region;
    a first conductive region between the gate region and the shallow trench isolation region, the first conductive region electrically contacted to the channel region; and
    a metal region between the gate region and the shallow trench isolation region;
    wherein a most lateral side and a top side of the first conductive region contact to the metal region.

8. The transistor structure in claim 7, further comprising a concave under the original surface, wherein at least part of the first conductive region is disposed in the concave, and at least part of the metal region is disposed in the concave.

9. The transistor structure in claim 8, wherein an isolator is disposed in the concave and under a bottom of the first conductive region, and the isolator comprises a lateral portion on the bottom pf the concave and a upward portion underneath the bottom of the first conductive region, wherein a top surface of the lateral portion of the isolator is lower than a top surface of the upward portion of the isolator.

10. A transistor structure comprising:
    a gate above a silicon surface;
    a spacer covering a sidewall of the gate;
    a channel region, wherein at least part of the channel region is under the gate and the spacer; and
    a first conductive region formed between the spacer and a side insulation layer, and extending upward along and contacting to the spacer, wherein a part of a sidewall of the first conductive region is covered by the side insulation layer, and the first conductive region comprises a first upper part, a second upper part and a lower part, wherein the first upper part and the second upper part contact to the spacer, and the lower part contacts to the channel region and is positioned on the bottom insulation layer;
    wherein a bottom insulation layer is formed in a first concave and the first conductive region is positioned on the bottom insulation layer.

11. The transistor structure of claim 10, wherein the first conductive region is partially formed in the first concave and the side insulation layer is partially formed in the first concave.

12. The transistor structure of claim 10, further comprising a contact region at least partially formed in the first concave, wherein the second upper part of the first conductive region contacts with the contact region, and the first upper part and the lower part of the first conductive region are separated from the contact region by the side insulation layer.

13. The transistor structure of claim 10, wherein the first conductive region comprises silicon, silicon-carbide (SiC), or silicon-germanium (SiGe).

14. A transistor structure comprising:
    a gate above a silicon surface;
    a spacer covering a sidewall of the gate;
    a channel region, wherein at least part of the channel region is under the gate and the spacer;
    a first conductive region formed between the spacer and a side insulation layer, and extending upward along and contacting to the spacer, wherein a part of a sidewall of the first conductive region is covered by the side insulation layer;
    a second conductive region partially formed in a second concave;
    another side insulation layer partially formed in the second concave; and
    another contact region partially formed in the second concave;

wherein the second conductive region comprises a first upper part, a second upper part and a lower part, the lower part of the second conductive region contacts to the channel region, the second upper part of the second conductive region contacts with the another contact region, and the first upper part and the lower part of the second conductive region are separated from the another contact region by the another side insulation layer.

15. The transistor structure of claim 14, further comprising another spacer covering another sidewall of the gate, wherein a length of the channel region is not less than a sum of lengths of the gate, the spacer, and the another spacer.

16. The transistor structure of claim 15, wherein the spacer and the another spacer are re-growth spacers.

17. The transistor structure of claim 15, further comprising an LDD zone positioned underneath the spacer.

* * * * *